US011869619B2

(12) United States Patent
Lee et al.

(10) Patent No.: US 11,869,619 B2
(45) Date of Patent: Jan. 9, 2024

(54) SYSTEMS AND METHODS OF REDUCING DETECTION ERROR AND DUTY ERROR IN MEMORY DEVICES

(71) Applicant: SanDisk Technologies LLC, Addison, TX (US)

(72) Inventors: Jang Woo Lee, San Ramon, CA (US); Srinivas Rajendra, San Jose, CA (US); Anil Pai, San Jose, CA (US); Venkatesh Prasad Ramachandra, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/828,708

(22) Filed: May 31, 2022

(65) Prior Publication Data

US 2023/0386600 A1    Nov. 30, 2023

(51) Int. Cl.
*G11C 29/00* (2006.01)
*G11C 29/52* (2006.01)
*G06F 1/12* (2006.01)

(52) U.S. Cl.
CPC .............. *G11C 29/52* (2013.01); *G06F 1/12* (2013.01)

(58) Field of Classification Search
CPC .......... G06F 1/12; G11C 29/023; G11C 29/52
See application file for complete search history.

(56) References Cited

U.S. PATENT DOCUMENTS

| 6,943,604 B2 * | 9/2005 | Minzoni | H03K 5/1565 |
| | | | 327/175 |
| 10,734,983 B1 * | 8/2020 | Jeter | G11C 11/409 |
| 11,699,492 B2 * | 7/2023 | Kim | H01L 25/0657 |
| | | | 711/154 |

* cited by examiner

*Primary Examiner* — Esaw T Abraham
(74) *Attorney, Agent, or Firm* — Hector A. Agdeppa; SHEPPARD MULLIN RICHTER & HAMPTON LLP

(57) ABSTRACT

Systems and methods are provided that combine a write duty cycle adjuster with write training to reduce detection and duty cycle errors in memory devices. Various embodiments herein perform write duty cycle adjuster operations to adjust a duty cycle of a clock signal that coordinates a data signal with a data operation on the memory device based on an error in the duty cycle, and performs write training operations to detect a skew between the data signal and the clock signal and adjust a sampling transition of the duty cycle of the clock signal to align with a valid data window of the data signal.

15 Claims, 11 Drawing Sheets

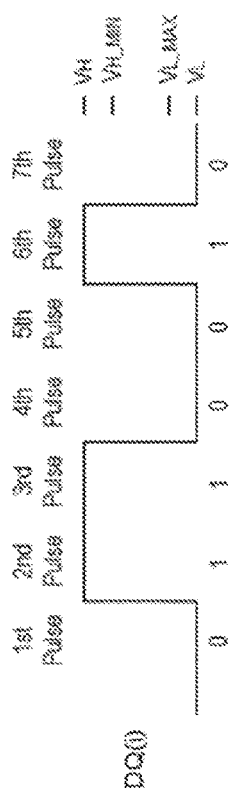
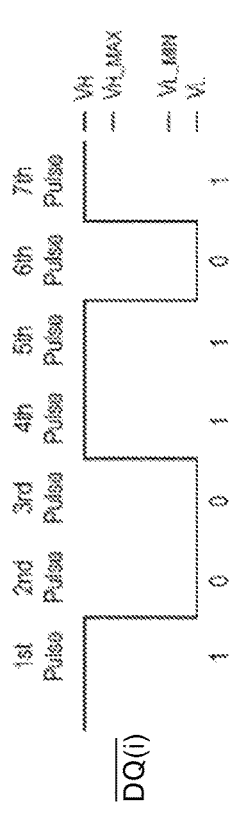
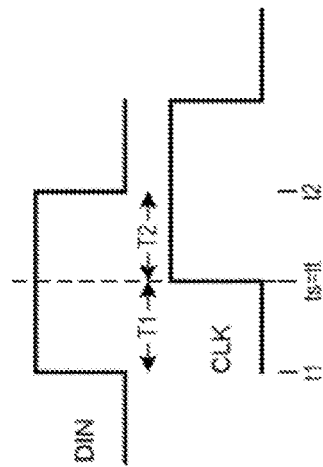
FIG. 1B
FIG. 1C
FIG. 1F
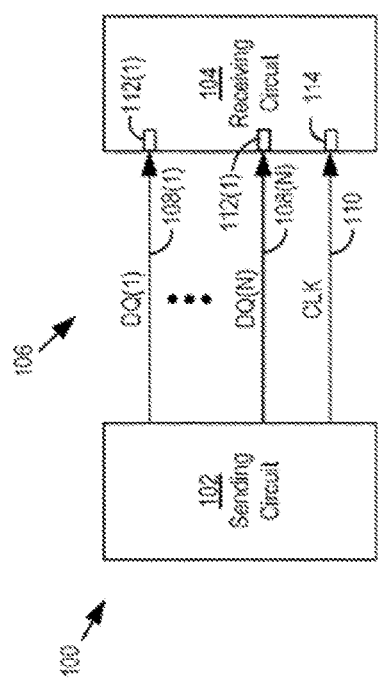
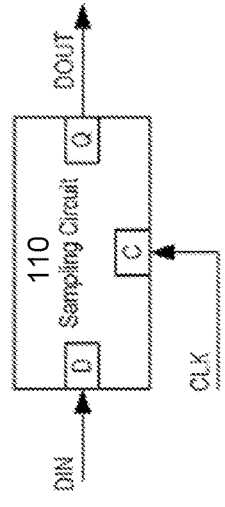
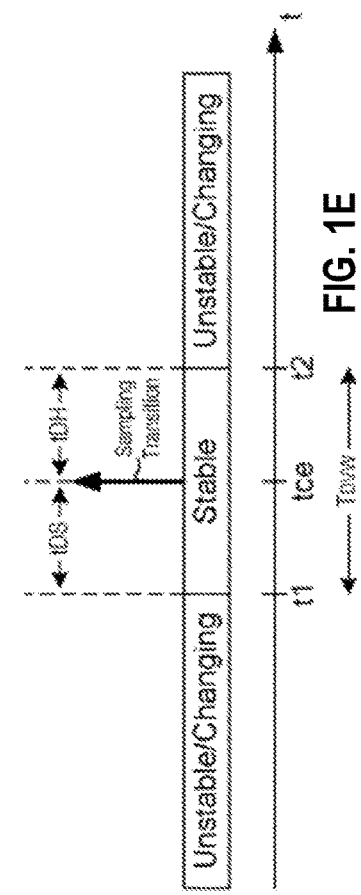
FIG. 1A
FIG. 1D
FIG. 1E

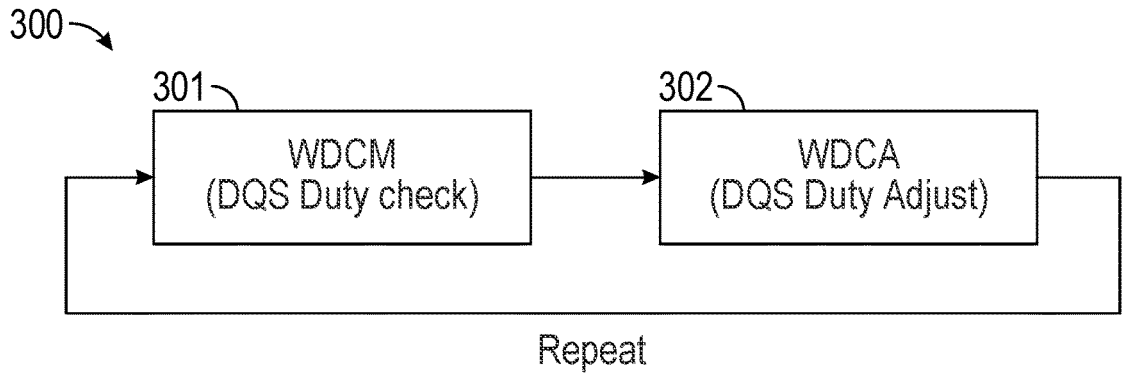
FIG. 3A
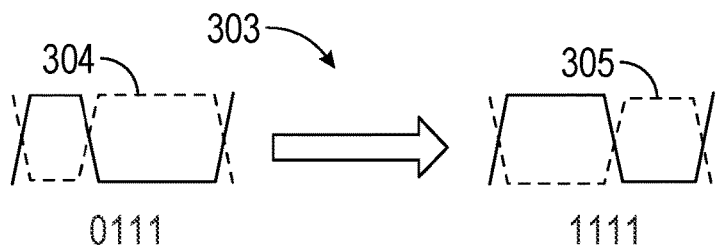
FIG. 3B
| Function | Register type | Operand | Data | Comment |
|---|---|---|---|---|
| WDCA | Write | (TBD) | 0000 ~ 1111 : +/- 7 Steps | Adopt concepts from DDR5 |
306
| Parameter | Min | Max | Unit | Comment |
|---|---|---|---|---|
| Write Duty Cycle Adjuster Range | (TBD) | (TBD) | ps | Adopt concepts from LPDDR5 |
307
| Function | Register type | Operand | Data | Comment |
|---|---|---|---|---|
| WDCM | Read | (TBD) | Duty > 50% or Duty < 50% | Adopt concepts from LPDDR5 |
308
FIG. 3C

SYSTEMS AND METHODS OF REDUCING DETECTION ERROR AND DUTY ERROR IN MEMORY DEVICES

DESCRIPTION OF RELATED ART

Semiconductor memory is widely used in various electronic devices, such as cellular telephones, digital cameras, personal digital assistants, medical electronics, mobile and non-mobile computing devices, vehicles, and so forth. Such semiconductor memory may comprise non-volatile memory and/or volatile memory. Contrary to volatile memory, non-volatile memory allows information to be stored and retained even when not connected to a source of power (e.g., a battery). Examples of non-volatile memory include flash memory (e.g., NAND-type and NOR-type flash memory) and Electrically Erasable Programmable Read-Only Memory (EEPROM).

As data transfer rates of non-volatile memory increase, margins of error for performing read, write, and similar operations decrease. For example, during a read operation, a controller associated with the non-volatile memory writes data to a non-volatile memory cell during a data bit interval defined by a left edge and a right edge of a duty cycle pulse associated with the non-volatile memory cell. In some instances, process, voltage, and/or temperature (PVT) variations in the non-volatile memory may introduce distortion into the duty cycle, thereby causing the data bit interval to shift or shrink. This distortion in the duty cycle may result in read and/or write operation failures in the non-volatile memory. Furthermore, the PVT variations may also cause changes to the duty cycle of a corresponding data signal, or timing of the data signal and/or the duty cycle pulse. The non-volatile memories may employ various methodologies to reduce and compensate for errors related to data operations (e.g., reads and/or writes) of the non-volatile memories in view of the variations and impacts on duty cycle pulse and data signal.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 1A is a block diagram of an example system that includes a sending circuit and a receiving circuit.

FIG. 1B is an example timing diagram of a data signal.

FIG. 1C is an example timing diagram of an inverted version of the data signal of FIG. 1B.

FIG. 1D is a block diagram of an example sampling circuit.

FIG. 1E is a schematic diagram of setup and hold time requirements of the sampling circuit of FIG. 1D.

FIG. 1F is a timing diagram of a sampling transition of a clock signal in a target sampling position.

FIG. 3A is a flow chart of a method of an embodiment for dynamically correcting duty cycle.

FIG. 3B is an example eye diagram of an input data signal and its logical inverse.

FIG. 3C depicts example tables of functions for dynamically correcting duty cycle.

Figure 2A:
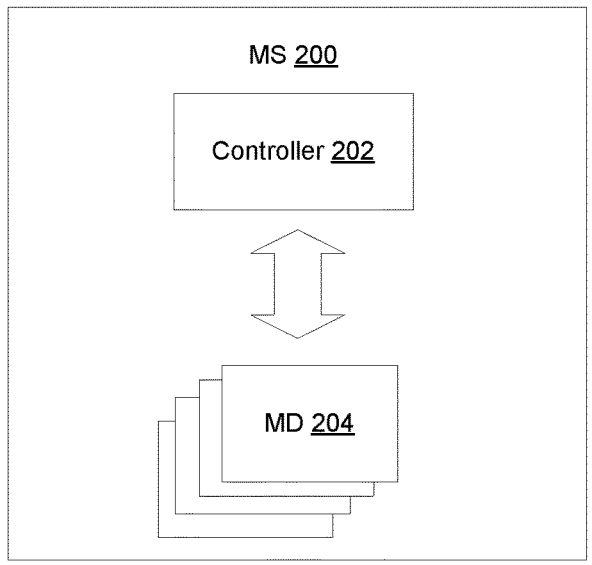
FIG. 2A illustrates a block diagram of a memory system used to implement various features of embodiments described in the present disclosure.

The figures are not exhaustive and do not limit the present disclosure to the precise form disclosed.

DETAILED DESCRIPTION

Computing systems often employ flash memories (such as NAND type flash memories) for short and/or long-term storage of data. The flash memories may include a flash memory controller (referred to herein as a controller) and a flash memory die (referred to herein as a memory die). The flash memories may employ a clock signal or a pair of complementary clock signals between the controller and the memory die to coordinate data reads from and writes to the memory die (i.e., data operations). For example, in response to a received clock signal and a corresponding data signal from the controller, the memory die writes the corresponding data to memory cells of the memory die. The memory die may read data from the memory cells and align a corresponding output data signal with a clock signal from the memory die for transmission to the controller for processing.

The controller, or similar component(s), may manage data write, read, and other operations between the memory die and the controller. For example, the controller may coordinate a data operation on a data signal (DQ) according to a clock signal, such as a differential clock signal pair comprising a positive data strobe or clock signal (DQS) and a negative, or complementary, data strobe or clock signal (DQSB), which may be an inverse of the clock signal DQS. For example, the data signal DQ may be sampled during a corresponding data window or interval according to the clock signal DQS/DQSB. That is, a data signal DQ may include even and odd bits, and the odd bits may be sampled during a data window or interval according to clock signal DQS while the even bits may be sampled during a data window or interval according to clock signal DQSB.

In some embodiments, various errors may cause issues in the coordination of the data operations between clock signal DQS/DQSB and the data signal DQ which may result in the corresponding operations being unsuccessful. Detection of these errors may enable performance of successful data operations over time as the flash memory experiences changes to its environment, to its components, to controls, and so forth.

A write duty cycle monitor (WDCM) may enable the controller to monitor a distortion in a duty cycle of the clock signal DQS/DQSB. A write duty cycle adjuster (WDCA) may be used to adjust the duty cycle of the clock signal DQS/DQSB in response to the detected distortion. The clock signal DQS/DQSB may experience one or more errors or skews, such as duty cycle changes, shifts, distortions, delays, and so forth that can introduce issues with alignment or synchronization of the clock signal DQS/DQSB with the corresponding data window in the flash memory. These errors can result in data operations failing. The WDCM and WDCA may be used to detect and compensate for errors in the duty cycle of the clock signal DQS/DQSB. However, because the WDCM/WDCA does not take into consideration the data signal DQ the WDCM/WDCA may be unable to detect and compensate for delays and shifts in the timing of the clock signal DQS/DQSB in relation to the data signal DQ or any variation related to the data signal DQ such as data flip-flop timing, duty cycle of the data signal DQ, and so forth. That is, for example, the WDCM/WDCA does not detect nor compensate for positional drift of the clock signal DQS/DQSB within a data window of the data signal DQ.

In some embodiments, process-voltage-temperature (PVT) variations may cause the changes to aspects of the clock signals DQS/DQSB, such as its duty cycle, timing of individual clock signals relative to corresponding data windows, and so forth. Additionally, the PVT variations of the flash memory and/or corresponding memory systems can introduce errors into aspects of the data signal DQ, such as its duty cycle or timing of flip flops, etc. For example, a change in temperature can change a resistance of a conductor that conveys the clock signal DQS/DQSB, impacting when the clock signal DQS/DQSB is received with respect to the data signal DQ (e.g., a data window formed by the data signal DQ). In some embodiments, an internal clock tree for the flash memory may correspond to a path by which the clock signal DQS/DQSB is communicated between a clock source and a corresponding destination, such as a memory cell of the flash memory. The WDCM/WDCA employed by certain embodiments may fail to detect one or more of drift or shifting of the clock signal DQS/DQSB within a data window of the data signal DQ drift or shifting of the data signal DQ changes to the duty cycle of the data signal DQ and so forth. Instead, a write training process, described further below, may be used in conjunction with the WDCM/WDCA to compensate for changes in the duty cycle of the clock signal DQS/DQSB as well as drift and shifting of the clock signal DQS/DQSB relative to the data signal DQ, drift and shifting of the data signal DQ, changes to the data signal DQ duty cycle, and other aspects that may change a data eye formed by the data signal DQ.

The systems and methods described herein may monitor an entire data eye diagram of the data signal DQ thereby monitoring a data window formed by the data signal DQ, the clock signal DQS/DQSB as it relates to the data signal DQ and the data eye, and so forth. By monitoring the entire data eye diagram in conjunction with monitoring the duty cycle of the clock signal DQS/DQSB, the systems and methods of the current disclosure may monitor and compensate for various aspects of both the clock signal DQS/DQSB as well as the data signal DQ. Thus, the systems and methods of the current disclosure provide benefits over the WDCM/WDCA, which is agnostic regarding variations to the data signal DQ.

These benefits include ensuring that margins in the data windows (for example, data latching margins) are maximized, monitoring the data signal DQ duty cycle, as well as the clock signal DQS/DQSB duty cycle, and so forth. By detecting and compensating for errors in addition to the clock signal DQS/DQSB duty cycle, detection errors for the flash memory implementing the systems and methods disclosed herein are reduced and additional errors sources can be identified and removed from or compensated in the flash memory. Such error reduction and compensation may enable data operation success with respect to the data signal DQ overcoming prospective errors in aspects of one or both of the data signal DQ and the clock signal DQS/DQSB. Such detection and compensation of errors may provide a perceived closed-loop system between the flash memory and the memory controller, thereby enabling compensation of both internal and external errors and error sources.

The write training process introduced above and described further below may enable the controller to detect both errors that impact the clock signal DQS/DQSB and errors that impact aspects of the data signal DQ such as its duty cycle, timing, etc. The controller may integrate WDCM/WDCA with the write training to further compensate for duty cycle errors for the clock signal DQS/DQSB. The integration of both the WDCM/WDCA and the write detection may reduce training and performance times of the flash memories. For example, a setup and hold time for sampling the data signal DQ may be reduced by approximately 50% when integrating the WDCA and write training processes as compared to only implementing the WDCM and WDCA processes and reduced by approximately 76% as compared to systems that do not implement either write training or WDCM/WDCA. Further details are provided below.

It should be noted that the terms "optimize," "optimal" and the like as used herein can be used to mean making or achieving performance as effective or perfect as possible. However, as one of ordinary skill in the art reading this document will recognize, perfection cannot always be achieved. Accordingly, these terms can also encompass making or achieving performance as good or effective as possible or practical under the given circumstances, or making or achieving performance better than that which can be achieved with other settings or parameters.

FIG. 1A shows one embodiment of a system 100 in which the embodiments disclosed herein may be implemented. The system 100 includes a sending circuit 102 and a receiving circuit 104 configured to communicate with each other via a communications bus 106. Both the sending circuit 102 and the receiver circuit 104 may be transceiver circuits, which can be configured to transmit and receive signals. For simplicity, with reference to FIG. 1A, one of the circuits 102 is designated as the sending circuit 102 and the other circuit 104 is designated as the receiving circuit 104.

Additionally, in particular example configurations, each of the sending circuit 102 and the receiving circuit 104 are integrated circuits (IC). In general, an integrated circuit (IC)—also referred to as a monolithic IC, a chip, or a microchip—is an assembly or a collection of electric circuit components (including active components, such as transistors and diodes, and passive components, such as capacitors and resistors) and their interconnections formed as a single unit, such as by being fabricated, on a substrate typically made of a semiconductor material such as silicon. For such embodiments, the sending circuit 102 and the receiving circuit 104 are separate integrated circuits, and the communication bus 106 is configured to communicate signals external to the separate sending circuit (IC) 102 and the receiving circuit (IC) 104.

The sending circuit 102 is configured to send a clock signal CLK and a plurality of data signals DQ to the receiving circuit 104 via a communications bus 106. Otherwise stated, the receiving circuit 104 is configured to receive a clock signal CLK and a plurality of data signals DQ from the sending circuit 102 via the communications bus 106. The plurality of data signals DQ are shown in FIG. 1A as including data signals DQ(1) to DQ(N), where N is two or more. For particular example configurations, N is 8, although other integer numbers of two or more may be possible for other example configurations.

From the perspective of the sending circuit 102, the clock signal CLK is an output clock signal, and the data signals DQ are output data signals in that they are the clock and data signals that the sending circuit 102 outputs to the receiving circuit 104. From the perspective of the receiving circuit 104, the clock signal CLK is an input clock signal, and the data signals DQ are input data signals in that they are the clock and data signals that the receiving circuit 104 receives from the sending circuit 102.

The communications bus 106 includes data lines 108(1) to 108(N) between the sending circuit 102 and the clock circuit 104. The receiving circuit has data input contacts 112(1) to 112(N), which are in physical and electrical contact with the respective data lines 108(1) to 108(N). The data input contacts 112(1) to 112(N) could be pins, pads, etc. The sending circuit 102 is configured to send the data signals DQ(1) to DQ(N) simultaneously and/or in parallel over the data lines 108(1) to 108(N) to the receiving circuit 104. Otherwise stated, the receiving circuit 104 is configured to receive the data signals DQ(1) to DQ(N) simultaneously and/or in parallel from over the data lines 108(1) to 108(N).

In addition, the communications bus 106 includes one or more clock lines 110 between the sending circuit 102 and the receiving circuit 104. The receiving circuit has one or more clock input contacts 114, which is/are in physical and electrical contact with the respective one or more clock lines 110. The clock input contact(s) could be pins, pads, etc. As described in further detail below, the input clock signal CLK may include a single-ended clock signal or a pair of complementary clock signals (e.g., DQS and DQSB, where DQSB is the logical inverse of DQS). Where the input clock signal CLK is a single-ended clock signal, the one or more clock lines 110 may include a single clock line. Where the input clock signal CLK is a pair of complementary clock signals DQS, DQSB, the one or more clock lines 110 may include two clock lines. The sending circuit 102 may be configured to transmit each clock signal DQS, DQSB of the complementary pair over a respective one of the two clock lines 110. The receiving circuit 104 is configured to receive the input clock signal CLK—either as a single-ended clock signal or as a pair of complementary clock signals—simultaneously and/or in parallel with the input of data signals DQ(1) to DQ(N).

The sending circuit 102 and the receiving circuit 104 form a source system 100 synchronous to a clock signal 110. A source synchronous system is a system in which a source circuit sends a data signal along with a clock signal to a destination circuit in order for the destination circuit to use the clock signal to identify the data values of the data signal. In the system 100, the sending circuit 102 is the source circuit, and the receiving circuit 104 is the destination circuit. However, as transceiver circuits, the sending circuit 102 and the receiving circuit 104 may change roles. For example, in certain operations, circuit 104 sends a clock signal and a data signal to circuit 102, and circuit 102 uses the clock signal to identify the data values of the data signal. For such operations, the circuit 104 becomes the sending or the source circuit, and the circuit 102 becomes the receiving or the destination circuit.

In general, a signal, such as the input clock signal CLK and the input data signals DQ may be at a level at a given point in time. As used herein, a level of a signal is a magnitude value, such as a voltage magnitude value or a current magnitude value. In some cases, the signal may be referred to as being at a high level or at a low level, transitioning between a high level and a low level, or transitioning between a low level and a high level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

With reference to FIGS. 1B and 1C, a high level of a signal is a level that is at or above a minimum high level $V_{H\_MIN}$, and a low level of the signal is a level that is at or below a maximum low level $V_{L\_MAX}$. The minimum high level $V_{H\_MIN}$ and the maximum low level $V_{L\_MAX}$ may be predetermined levels or values, and in particular example configurations, predetermined levels or values specified as part of a swing requirement with which the source circuit 102 is configured to comply when transmitting the signal. A signal that transitions according to and/or in compliance with the swing requirement transitions to a high level that is at or above the minimum high level $V_{H\_MIN}$ of the swing requirement, and transitions to a low level that is at or below the maximum low level $V_{L\_MAX}$ of the swing requirement.

In general, a signal performs transitions between its high level and its low level. A given transition of a signal may be one of two transition types, including a rising transition and a falling transition. A signal performs a rising transition when the signal transitions from its low level to its high level, and performs a falling transition when the signal transitions from its high level to its low level.

A portion of a magnitude waveform of a signal over a transition is referred to as an edge. In particular, a portion of the magnitude waveform over a rising transition is a rising edge and a portion of the magnitude waveform over a falling transition is a falling edge.

Also, a clock signal, such as the input clock signal CLK, is a signal that has repetitive cycles occurring over successive periods T. Within a cycle, one of the portions is at a high level and the other portion is at a low level. Accordingly, the portions may be defined by consecutive rising and falling transitions or edges of the clock signal. For example, a given rising edge or a given falling edge may define or mark a boundary when one portion ends and a next portion, either of the same cycle or of a next cycle, begins.

In addition, a clock signal may include clock pulses that are formed or defined by the rising and falling edges of the clock signal. In particular example configurations, the clock pulses of a clock signal correspond to the high level of the clock signal, in that each clock pulse is defined by a rising edge followed by a period where the clock signal is at its high level, and then followed by a falling edge. A pulse width of a given clock pulse is a time duration extending from a time that the magnitude of the rising edge of the clock pulse is at or rises to a predetermined level (e.g., 50% of the high level) to a time that the magnitude of the falling edge of the clock pulse is at or falls to the predetermined level. The clock pulses of the clock signal may occur according to the frequency of the clock signal.

Additionally, a data signal is a signal that carries and/or includes data. The data carried by and/or included in a data signal includes a bit sequence of bits, where each bit includes or has a single-bit logic value of "1" or "0". The data signal may include a series or sequence of data pulses corresponding to a bit sequence of the data. Each data pulse may be at a level that indicates a data value, otherwise referred to as a logic level or a logic value. In addition, each data value is represented by a binary number or a binary value that includes one or more digits corresponding to and/or representing the one or more bits of the bit sequence. A duration of a data pulse is an amount of time that the level of the data pulse indicates the data value that the data pulse represents.

FIG. 1B shows a timing diagram of magnitude waveform of a portion of an example $i^{th}$ data signal DQ(i) representative of one of the input data signals DQ(1) to DQ(N). For purposes of illustration, the $i^{th}$ data signal DQ(i) shown in FIG. 1B includes seven data pulses. Each data pulse is shown as being either at a high level at or above a minimum high level $V_{H\_MIN}$ or at a low level at or below a maximum low level $V_{L\_MAX}$. For the example data signal DQ(i) in FIG. 1B, the high level and the low level each indicate a single-bit logic value of "1" or "0", where the high level corresponds to and/or indicates a single-bit logic value of "1" (otherwise referred to as a logic 1 value) and the low level corresponds to and/or indicates a single-bit logic value of "0" (otherwise referred to as a logic 0 value). Other example data signals where different levels of the magnitude waveform correspond to and/or indicate multi-bit logic values (i.e., logic values that each include two or more digits or bits) may be possible.

For two consecutive data pulses of the $i^{th}$ data signal DQ(i), where the two consecutive pulses correspond to different logic levels, the data signal DQ(i) performs a rising transition or a falling transition to transition between the two consecutive data pulses. For the example shown in FIG. 1B, where one pulse in the sequence indicates a logic 0 value and a next pulse in the sequence indicates a logic 1 value, the $i^{th}$ data signal DQ(i) performs a rising transition to transition between the first and second pulses. On the other hand, where one pulse corresponds to a logic 1 value and a next pulse indicates a logic 0 value, the $i^{th}$ data signal DQ(i) performs a falling transition to transition between the first and second pulses. In addition, where two consecutive pulses indicate the same logic level, then as the pulse sequence transitions from the first data pulse to the next data pulse, the level of the $i^{th}$ data signal DQ(i) stays the same during those two pulses, and a rising transition or a falling transition may not occur. Regardless of whether a change in level of the $i^{th}$ data signal DQ(i) occurs when transitioning between two consecutive data pulses, the start of a given data pulse is referred to as a starting transition of the data pulse, and the end of a given data pulse is referred to as an ending transition of the data pulse.

In some embodiments, the receiving circuit 104 might possibly invert the data signal as the data signal is being processed. In one embodiment, the receiving circuit 104 inverts the data signal by passing the data signal through an odd number of inverters. FIG. 1C depicts an inverted version of the data signal of FIG. 1B (e.g., $\overline{DQ(i)}$). Inverting the data signal causes the low voltage pulses of the data signal to be high voltage pulses, and causes the high voltage pulses of the data signal to be low voltage pulses. Also, inverting the data signal causes a "0" to be a "1", and likewise causes a "1" to be a "0".

Referring again to FIG. 1A, the receiving circuit 104 may include sampling circuitry that performs sampling actions to identify data values of data carried by the input data signals DQ. As used herein, a sampling action is an action performed to determine, identify, detect, capture, obtain, or latch onto, a level or magnitude of a signal at a given point in time. A circuit that performs sampling actions is referred to as a sampling circuit, and the signal on which the sampling circuit performs a sampling action is referred to as an input signal of the sampling circuit. A sampling circuit performing a sampling action on an input signal may include an input terminal configured to receive the input signal. In addition, a sampling circuit performing a sampling action may output or present the level of the input signal that it identifies. The sampling circuit may do so by generating an output signal at an output terminal of the sampling circuit at a level that indicates or corresponds to the level of the input signal that the sampling circuit identifies at its input terminal. Accordingly, a sampling circuit samples an input signal, samples a level of the input signal, or performs a sampling action on an input signal by identifying a level of an input signal and outputting an output signal at a level indicating the level of the input signal that it identifies.

In particular example configurations, the sampling circuit generates its output signal at a level that matches, directly corresponds to, or is equal in value to the level of the input signal that it identifies. For example, if the sampling circuit identifies its input signal at a low level, then the sampling circuit performs a sampling action by generating its output signal at its output terminal at a low level, and if the sampling circuit identifies its input signal at a high level, then the sampling circuit performs a sampling action by generating its output signal at its output terminal at a high level.

In addition, a sampling circuit performs sampling actions in response to detecting a transition in a clock. The clock transition may be a rising transition or a falling transition, although in some embodiments, sampling transitions may include both rising transitions and falling transitions. Each time a sampling circuit detects a clock transition, the sampling circuit samples the input signal. The input signal that a sampling circuit samples is referred to as its input data signal, and the output signal that a sampling circuit generates and outputs in response to performing sampling actions on the input signal is referred to as its output data signal.

The sampling circuitry of the receiver circuit 104 may include a separate sampling circuit for each input data signal D1(1) to DQ(N). Each of the sampling circuits is configured to sample the levels of a respective one of the data signals DQ(1) to DQ(N). An example sampling circuit is a flip flop, such a D flip flop for example.

FIG. 1D is a block diagram of an example sampling circuit 110, such as a flip flop or a latch. The sampling circuit 110 includes a data input terminal or node D, a data output terminal or node Q, and a clock input terminal or node C. The data input terminal D is configured to receive an input data signal DIN of which the sampling circuit 110 is configured to sample. The clock input terminal C is configured to receive a clock signal CLK of which the sampling circuit 110 is configured to detect sampling transitions. The data output terminal Q is configured to output an output data signal DOUT at levels and at times based on the levels of the input data signal DIN and the sampling transitions of the clock signal CLK. In particular, the sampling circuit 110 is configured to detect when each of the sampling transitions of the clock signal CLK occur. When the sampling circuit 110 detects that a sampling transition occurs, the sampling circuit 110 samples the level of the input data signal DIN at the data input terminal D, and generates the output data signal DOUT at the level of the input data signal DIN that the sampling circuit 110 identified. The sampling circuit 110 maintains or holds the output data signal DOUT at the data output terminal Q at the level it identified until it detects the next sampling transition of the clock signal CLK. Upon detecting the next sampling transition of the clock signal CLK, the sampling circuit 110 will again identify the level of the input data signal DIN at the data input terminal D, and generate the output data signal DOUT at the level of the input data signal DIN that the sampling circuit 110 identified in response to the next sampling transition. The sampling circuit 110 may continue to operate in this manner as it continues to receive additional data pulses of the input data signal DIN and detect sampling transitions of the clock signal CLK.

FIG. 1E is a schematic diagram illustrating setup time and hold time requirements of the sampling circuit 110. A sampling transition of the clock signal CLK is shown as occurring at a clock event time tce. An occurrence of a sampling transition of the clock signal CLK may be referred to as a clock event. When the sampling circuit 110 detects a sampling transition, it detects a clock event. A time duration from a first time t1 to the clock event time tce denotes the setup time tDS, and a time duration from the clock event time tce to a second time denotes the hold time tDH. In order to meet the setup and hold requirements of the sampling circuit 110, the level of a data pulse of the input data signal DIN should be stable from the first time t1 to the second time t2. A setup violation occurs when the level of input data signal DIN is unstable (it is still changing) after the first time t1 occurs. In other words, a setup violation occurs when the actual amount of time that the level of the input data signal DIN is stable before occurrence of the sampling transition at the clock event time tce is less than the amount of the setup time tDS. In addition, a hold violation occurs when the level of the input data signal DIN is unstable (it changes) before the second time t2. In other words, a hold violation occurs when the actual amount of time that the level of the input data signal DIN is stable after occurrence of the sampling transition at the clock event time tce is less than the amount of the hold time tDH. Setup violations and/or hold violations may occur, for example, due to PVT variations introducing errors in the clock signal CLK that cause drift and shifting of the clock signal CLK relative to the data signal DQ and/or changes in the duty cycle of the clock signal CLK, data signal DQ or a combination thereof.

For a data pulse of the input data signal DIN that the sampling circuit 110 is to sample, at least a portion of the duration that a level of the data pulse is stable—e.g., at least a portion of the duration that the data pulse is at the high level or at the low level—defines a data valid window $T_{DVW}$. A data valid window $T_{DVW}$ is a time period or duration over which a given data pulse occurs during which a sampling circuit is to detect a sampling transition of the clock signal in order to avoid a setup violation and a hold violation. If the sampling transition occurs before the start of the data valid window $T_{DVW}$, then a setup violation occurs—either because the sampling transition occurred before the starting transition of the data pulse, or because the sampling transition occurred too close to after the starting transition that the actual amount of time that the level of the data pulse is stable before occurrence of the sampling transition is less than the setup time tDS. In addition, if the sampling transition occurs after the end of the data valid window $T_{DVW}$, then a hold violation occurs—either because the sampling transition occurred after the ending transition of the data pulse or occurred too close to before the ending transition that the actual amount of time that the level of the data pulse is stable after occurrence of the sampling transition is less than the hold time tDH.

Ideally, the sampling circuit 110 receives the clock signal CLK and the input data signal DIN relative to each other such that the sampling circuit 110 reliably or accurately samples the level of each data pulse in order to correctly identify the data value that each data pulse represents. Configuring the sampling circuit 110 to sample each data pulse in the middle or at a middle point of the duration of each pulse may maximize the latch margin and maximize the chances of this ideal situation occurring. The ideal time at which to sample a data pulse is referred to as a target sampling time of the data pulse. Ideally, the sampling circuit 110 identifies sampling transitions in the middle of the durations of the data pulses and/or at the target sampling times of the data pulses. Accordingly, a given sampling transition is in a target sampling position when the sampling transition occurs at the target sampling time of its associated data pulse.

FIG. 1F shows a data pulse of the input data signal DIN and a pulse of the clock signal CLK, illustrating the ideal case where a sampling transition of the clock pulse is in the target sampling position. In FIG. 1F, a starting transition of the data pulse occurs at a first time t1, and an ending transition of the data pulse occurs at a second time t2. A target sampling time tt of the data pulse occurs in the middle between the first time t1 and the second time t2. Accordingly, a first time period T1 extending from the first time t1 to the target sampling time tt is the same as or equal to a second time period T2 extending from the target sampling time tt to the second time t2. Additionally, the sampling transition associated with the data pulse is the rising transition of the clock pulse. The sampling transition occurs at a sampling time ts. In FIG. 1F, for the ideal case, the sampling transition occurs at the target sampling time—i.e., the sampling time ts and the target sampling time tt are the same.

In actuality, when the sending circuit 102 sends the data signals DQ and the clock signal CLK to the receiving circuit 104, the sampling circuitry of the receiving circuit 104 may not receive the clock pulses in their respective target sampling positions. For a given sampling circuit that samples data pulses of an input data signal in response to sampling transitions of a clock signal, where the sampling transitions occur at times different than the target sampling times tt, the input data signal and the clock signal have skew between them, for example, due to PVT variations in the system. In general, as used herein, skew between a clock signal and a data signal is a deviation of a sampling transition of the clock signal from a target sampling position to sample a data pulse of the data signal. In addition, with respect to sampling times, skew between a clock signal and a data signal is a deviation of a sampling time ts from a target sampling time tt to sample a data pulse of a data signal. For a given pair of clock and data signals, where the clock signal performs sampling transitions at sampling times ts that match or occur at the same times as the target sampling times tt, the clock and data signals do not have skew between them. Alternatively, where the clock signal performs sampling transitions at sampling times ts different than the target sampling times tt (i.e., before or after the target sampling times tt), the clock and data signals have skew between them. An amount of skew (or skew amount) may be quantified by the difference in time between the sampling time ts and the target sampling time tt.

Various manufacturing or environmental conditions may cause skew between clock and data signals, such as imperfections in the alignment and transmission of the clock and data signals by the sending circuit 102, differences in propagation delay in the lines of the communications bus 106, or process-voltage-temperature (PVT) fluctuations, as non-limiting examples. Not only do such manufacturing or environmental conditions displace sampling transitions of the clock signal CLK from their target sampling positions, but they may displace the sampling transitions by different amounts for sampling different data signals DQ. That is, for sampling circuits that sample the input data signals DQ in response to sampling transitions of the clock signal CLK, some sampling circuits may receive sampling transitions of the clock signal CLK further away from the target sampling transitions than others. As operating frequencies continue to increase, differences in timing between the clock signal CLK and different data signals DQ may be more pronounced, requiring correction processes that can flexibly or independently correct for differences in timing for multiple data signals DQ.

While the above description in connection with FIGS. 1A-1E are made in reference to single-ended clock signal CLK, the same concepts apply to a pair of complementary clock signals (e.g., DQS and DQSB). For example, clock signal DQS may be used to coordinate sampling of odd bits of the data signal DQ (i) and the complementary clock signal DQSB used to coordinate sampling of event bits of the data signal DQ(i). In this case, a DQS sampling transition of the clock signal DQS occurs at a clock event time tdqs and a DQSB sampling transition of the clock signal DQSB occurs at a clock event time tdqsb. Each sampling transition of DQS and DQSB includes respective setup and hold times. In order to meet the setup and hold requirements of the sampling circuit 110, the level of an odd data pulse (e.g., $1^{st}$, $3^{rd}$, $5^{th}$, etc. data pulse) of the input data signal DIN should be stable (e.g., the respective data valid window) over the setup and hold time of the for clock signal DQS and the level of an even data pulse (e.g., 2nd, 4th, 6th, etc. data pulse) of the input data signal DIN should be stable over the setup and hold time of the for clock signal DQSB.

Thus, if the sampling transition of the DQS occurs before the start of the data valid window $T_{DVW}$ for an odd data pulse, then a setup violation occurs—either because the sampling transition occurred before the starting transition of the odd data pulse, or because the sampling transition occurred too close to after the starting transition that the actual amount of time that the level of the odd data pulse is stable before occurrence of the sampling transition is less than the setup time tDS. Similarly, if the sampling transition of the DQSB occurs before the start of the data valid window $T_{DVW}$ for an even data pulse, then a setup violation occurs. In addition, if the sampling transition of the DQS occurs after the end of the data valid window $T_{DVW}$ for an odd data pulse or if the sample transition of the DQSB occurs after the end of the data valid window $T_{DVW}$ for an even data pulse, then a hold violation occurs—either because the sampling transition occurred after the ending transition of the respective data pulse or occurred too close to before the ending transition that the actual amount of time that the level of the respective data pulse is stable after occurrence of the sampling transition is less than the respective hold time.

Ideally, the sampling circuit 110 identifies sampling transitions of the DQS and DQSB in the middle of the durations of the respective data pulses and/or at the target sampling times of the respective data pulses, as described in connection with FIG. 1F above. Accordingly, a given sampling transition is in a target sampling position when the sampling transition occurs at the target sampling time of its associated data pulse.

FIG. 2A illustrates a block diagram of a memory system 200. The memory system 200 may include a controller 202 and memory that may be made up of one or more memory dies 204. As used herein, the term die refers to the set of memory cells and associated circuitry for managing the physical operation of those memory cells that are formed on a single semiconductor substrate. The controller 202 may interface with a host system and transmit command sequences for read, program, and erase operations to the memory die(s) 204. The interface may include a bus or other communication mechanism, not shown, for communicating information.

The controller 202 (e.g., a flash memory controller) and/or any of the modules therein can take the form of processing circuitry, a microprocessor or processor, and/or a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 202 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

In some embodiments, the controller 202 is a device that manages data stored in the memory die(s) 204 and communicates with a host, such as a computer or electronic device. The controller 202 can have various functionality in addition to the specific functionality described herein. For example, the controller 202 can format the memory dies 204 to ensure that they are operating properly, map out failed flash memory cells, and allocate spare cells to be substituted for future failed cells. Some part of the spare cells can be used to hold firmware to operate the controller 202 and implement other features. In operation, when a host needs to read data from or write data to the memory die(s) 204, the host will communicate with the controller 202. If the host provides a logical address to which data is to be read/written, the controller 202 can convert the logical address received from the host to a physical address in the memory die(s) 204. Alternatively, the host can provide the physical address to the controller 202. The controller 202 can also perform various memory management functions and operations, such as, but not limited to, wear leveling (distributing writes to avoid wearing out specific blocks of memory that would otherwise be repeatedly written to), garbage collection (after a block is full, moving only the valid pages of data to a new block, so the full block can be erased and reused), erasing, programming, and reading.

The interface between the controller 202 and the non-volatile memory die(s) 204 may be any suitable interface, such as a flash or memory interface. For some example embodiments, the memory system 200 may be a card-based system, such as a secure digital (SD) or a micro secure digital (micro-SD) card. In alternate example embodiments, the memory system 200 may be part of an embedded memory system.

The controller 202 may include a front-end module that interfaces with a host, a back-end module that interfaces with the memory die(s) 204, such as the memory interface, and various other modules that perform various functions of the memory system 200. In general, a module may be hardware or a combination of hardware and software. Module may include one or more electronic circuits that include electronic components for performing the functionality of one or more instructions. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition, or alternatively, each module may include memory hardware that comprises instructions executable with a processor or processor circuitry to implement one or more of the features of the module. When any one module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module. Each module may include one or more instructions for execution of logic of one or more circuits described herein. In some embodiments, the controller 202 may fetch, decode, and/or execute the one or more instructions to control processes and/or operations for enabling aspects of the present disclosure.

In general, the word "component," "module," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression, or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

In the example illustrated in FIG. 2A, the memory system 200 is shown as including a single channel between the controller 202 and the non-volatile memory die(s) 204. However, the subject matter described herein is not limited to memory systems having a single memory channel. For example, in some memory systems, such as those embodying NAND architectures, 2, 4, 8 or more channels may exist between the controller 202 and the memory die(s) 204, depending on capabilities of the controller 202. In any of the embodiments described herein, more than a single channel may exist between the controller 202 and the memory dies 204, even if a single channel is shown in the drawings.

Figure 2B:
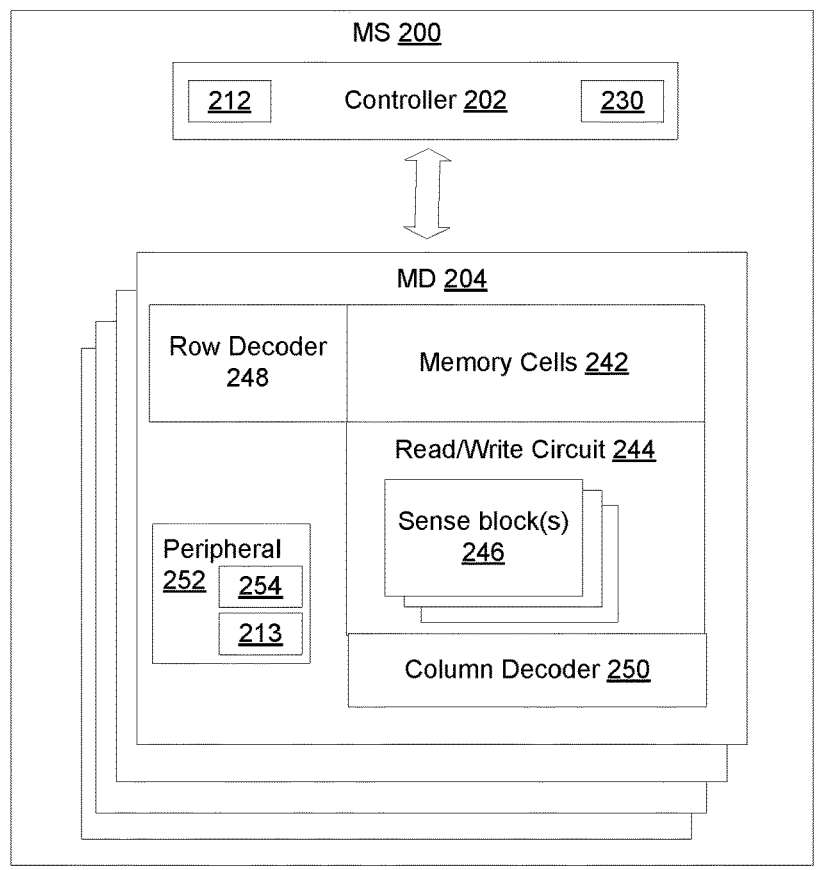
FIG. 2B illustrates a block diagram of example components of the memory system of FIG. 2A in more detail, which can be used to implement various features of embodiments described in the present disclosure.

FIG. 2B illustrates a block diagram of example components of the memory system 200, and more specifically the memory dies 204, in more detail. As shown, the memory dies 204 may include a memory cell structure 242 that includes a plurality of memory cells or memory elements (not individually shown). Any suitable type of memory can be used for the memory cells. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor memory elements capable of storing information. Each type of memory may have different configurations in the memory cell structure 242. For example, flash memory devices may be configured in a NAND or a NOR configuration.

The memory can be formed from passive and/or active elements, in any combination(s). By way of non-limiting example, passive semiconductor memory elements include ReRAM device elements, which in some embodiments, include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments, include elements containing a charge storage region, such as a floating gate, conductive nanoparticles, or a charge storage dielectric material.

Multiple memory elements in the memory cell structure may be configured so that they are connected in series or so that each element is individually accessible. By way of non-limiting example, flash memory devices in a NAND configuration (NAND memory) typically contain memory elements connected in series. The memory cell structure 242 can include a NAND memory array. The NAND memory array may be configured so that the array is composed of multiple NAND strings of memory in which a NAND string is composed of multiple memory elements sharing a single bit line and accessed as a group.

The NAND strings can include multiple transistors in series between a first select gate (i.e., a drain-side select gate) and a second select gate (i.e., a source-side select gate). A first select gate can connect the NAND string to a bit line. The second select gate can connect the NAND string to a source line. Each of the transistors in the NAND string can include a control gate and a floating gate. Control gates of respective transistors can be connected to word lines, respectively. Although four floating-gate transistors are described with reference to a NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system, for example the memory system 200, using a NAND flash memory structure includes a plurality of NAND strings within a memory block. In some cases, the NAND strings within a memory block may share a common well (e.g., a P-well). Each NAND string may be connected to a common source line by its source-side select gate (e.g., controlled by select line) and connected to its associated bit line by its drain-side select gate (e.g., controlled by select line). Typically, each bit line runs on top of (or over) its associated NAND string in a direction perpendicular to the word lines and is connected to a sense amplifier.

Alternatively to a NAND memory array, memory elements may be configured so that each element is individually accessible, e.g., a NOR memory array. NAND and NOR memory configurations are merely non-limiting examples, and memory elements may be otherwise configured. Although technology using NAND-type flash memory may be described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

The semiconductor memory elements located within and/or over a substrate of memory die 204 may be arranged in two or three dimensions, such as a two-dimensional (2D) memory structure or a three-dimensional (3D) memory structure. In a two-dimensional memory structure, the semiconductor memory elements are arranged in a single plane or a single memory device level. Typically, in a two-dimensional memory structure, memory elements are arranged in a plane (e.g., in an x-z direction plane) which extends substantially parallel to a major surface of a substrate that supports the memory elements. The substrate may be a wafer over or in which the layer of the memory elements is formed, or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the y direction is substantially perpendicular, and the x and z directions are substantially parallel to the major surface of the substrate).

As previously alluded to, in one embodiment, the memory array 242 may be divided into many blocks (e.g., blocks 0-1023, or another amount) of memory cells. A block contains a set of NAND strings, which are accessed via bit lines and word lines. Typically, all the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

The memory die 204 may further include read/write circuits 244 that include a plurality or p-number of sense blocks (also referred to as sense modules or sense circuits). The sense blocks can be configured to participate in reading or programming a page of memory cells in parallel. In one embodiment, each sense block includes a sense amplifier and a set of latches connected to the bit line. The latches store data to be written and/or data that has been read. The sense blocks may include bit line drivers.

The memory die 204 may also include a row address decoder 248 and a column address decoder 250. The row address decoder 248 may decode a row address and select a particular word line in the memory array 242 when reading or writing data to/from the memory cells 242. The column address decoder 250 may decode a column address to select a particular group of bit lines in the memory array 242 to read/write from read/write circuits 244.

In addition, the non-volatile memory die 204 may include peripheral circuitry 252. The peripheral circuitry 252 may include control logic circuitry, which may be implemented as a state machine, that provides on-chip control of memory operations as well as status information to the controller 202. The peripheral circuitry 252 may also include an on-chip address decoder that provides an address interface between addressing used by the controller 202 and/or a host and the hardware addressing used by the row and column decoders 248 and 250, respectively. In addition, the peripheral circuitry 252 may also include volatile memory. An example configuration of the volatile memory may include latches, although other configurations are possible.

Additionally, the peripheral circuitry 252 may include power control circuitry that is configured to generate and supply voltages to the memory array 242. Such voltages may include voltages (including program voltage pulses) to the word lines, erase voltages (including erase voltage pulses), the source select gate bias voltage to the source select gate bias line; the drain select gate bias voltage to the drain select gate bias line, and a cell source voltage on the source lines. Still other voltages may be supplied to the memory array 242, the read/write circuits 244, and/or other circuit components on the memory die 204. The various voltages that are supplied by the power control circuitry are described in further detail below. The power control circuitry may include any of various circuit topologies or configurations to supply the voltages at appropriate levels to perform the read, write, and erase operations, such as driver circuits, charge pumps 254, reference voltage generators, and pulse generation circuits, or a combination thereof. Other types of circuits to generate the voltages may be possible. In addition, the power control circuitry may communicate with and/or be controlled by the control logic circuitry, the read/write circuits 244, and/or the sense blocks to supply the voltages at appropriate levels and appropriate times to carry out the memory operations.

To program a target memory cell, and in particular a floating gate transistor (FGT), the power control circuitry can apply a program voltage to the control gate of the memory cell, and the bit line that is connected to the target memory cell is grounded, which in turn causes electrons from the channel to be injected into the floating gate. As previously described, in a block, one memory cell in each of the NAND strings can share the same word line.

As previously described, the threshold voltage VTH of a memory cell may identify the data value of the data it is storing. For a given read operation in a block, a memory cell from which data is to be read is referred to as a selected memory cell, and a memory cell from which data is not to be read is referred to as an unselected memory cell. So, when data is to be read from a page of memory cells for a particular read operation, those memory cells in the page are the selected memory cells, and the memory cells of the block that are not part of the page are the unselected memory cells. Additionally, a word line connected to the page of selected memory cells is referred to as the selected word line, and the other word lines of the block are referred to as the unselected word lines.

During a read operation to read data stored in target memory cells of a page, the sense blocks may be configured to perform a sense operation that senses whether current is flowing through the bit lines connected to the target memory cells of the page. The voltage supply circuitry (described with reference to peripheral circuitry 252 in FIG. 2B) may supply voltages on the selected and unselected word lines at appropriate levels that cause current to flow or not to flow based on the threshold voltage VTH of the target memory cells. For some configurations, the level of the voltage supplied to the selected word lines may vary depending on the states of the memory cells.

The voltage supply circuitry may also bias the bit lines so that the high supply voltage is applied to the drain side of the bit lines and the cell source voltage is applied to the source side of the bit lines to allow for the current flow, provided that the threshold voltage VTH of the selected memory cell allows for it.

In some embodiments, the controller 202 may include a memory interface 230, a duty cycle control circuitry, and a duty cycle monitor 212. The memory interface 230 may provide command sequences to the memory die 204 and receive status information from the memory die 204, for example, to execute WDCM and WDCA as described below. In one embodiment, the memory interface 230 may be a double data rate (DDR) interface, such as Toggle Mode 200, 400, or 800 interfaces. The duty cycle control circuit may adjust a duty cycle of a clock signal provided to the memory die 204, while the duty cycle monitor 212 may monitor a duty cycle of a clock signal returned from the memory die 204. More specifically, the duty cycle monitor 212 may be configured to monitor continuously or intermittently the clock signal coming back from the memory die 204. The duty cycle monitor 212 may monitor whether the clock duty cycle meets some threshold or target range (e.g., close to 50% or within some pre-defined range (for example, +/−1%)).

The memory die 204 may further comprise a duty cycle monitor 213 included in the peripheral circuitry 252, for example. The duty cycle monitor 213 may monitor the duty cycle of the clock signal sent from the controller 202. The duty cycle monitor 213 may perform dynamic duty cycle correction during a write operation as part of a two-step operation.

FIG. 3A illustrates a process flow 300 for dynamically correcting a duty dynamic duty cycle correction during as a two-step operation. FIG. 3C are tables of function parameters for each step of process flow 300. In step one (block 301) a WDCM function is executed, which may take place during the write operation, the clock signal is provided from the controller 202 to the memory die 204. The clock signal may pass through the duty cycle control circuit and go to the memory die 204. The duty cycle monitor 213 may monitor the duty cycle of the clock signal and generate a duty cycle value, which may be saved in the memory. Table 308 provides the function parameters for the WDCM function executed at block 301. For example, function WDCA monitors the duty cycle of the clock signal via a read register type and generates a duty cycle data value. For example, the WDCM function generates a data value indicating if the duty cycle is less than 50% (or a predefined range) or greater than 50% (or the predefined range), which is stored in memory. Controller 202 may utilize the table 308 to adjust duty cycle. To do so, the controller 202 receives feedback from a memory die 204 according to table 308.

In step two (block 302) a WDCA function is executed, which takes place during a subsequent read operation, the controller 202 communicates with the memory die 204 to collect the duty cycle information stored in the data sent from the memory die. In some embodiments, this information may be provided as data to the controller 202 (for example, over a data bus). The controller 202 may use this information to program the duty cycle control circuit accordingly to correct the duty cycle of the clock signal provided from the controller 202 to the memory die 204. For example, the clock may be started with a lower speed for duty cycle correction, and after the correction, the clock can run with full speed. Table 306 and 307 provides the function parameters of the controller 202 for performing the WDCA function executed at block 302. Tables 306-308 include parameter values of "TBD", which indicates that such values are not yet defined. The min/max control range of table 307 may be minus 5% and plus 5%, respectively. However, other min/max parameters may be used according to the desired application.

FIG. 3B is an example eye diagram 303 of an input data signal and its logical inverse. Through method 300, the controller 202 is able to change duty cycle using WDCA and the memory die 204 measures duty distortion with WDCM, as described above. The controller 202 receives the measurement from the memory die 204 and adjusts the duty cycle using the WDCA process. FIG. 3B illustrates the how the duty cycle is changed from an initial duty cycle 304 to a distorted duty cycle 305 as measured by the memory die 204 and reported to the controller 202.

As another example, at block 301, in a case where the duty cycle is below a predefined range (e.g., +/−1%) of 50%, the controller 102 increases the falling delay and/or decrease the rising delay of the duty cycle. In a case where the duty cycle is above the predefined range of 50%, the controller 102 increases the rising delay and/or decrease the falling delay of the duty cycle. The process 300 may then be repeated, for example, duty cycle monitor 213 may monitor the corrected duty cycle of the clock signal for subsequent skew or changes.

Figure 3D:
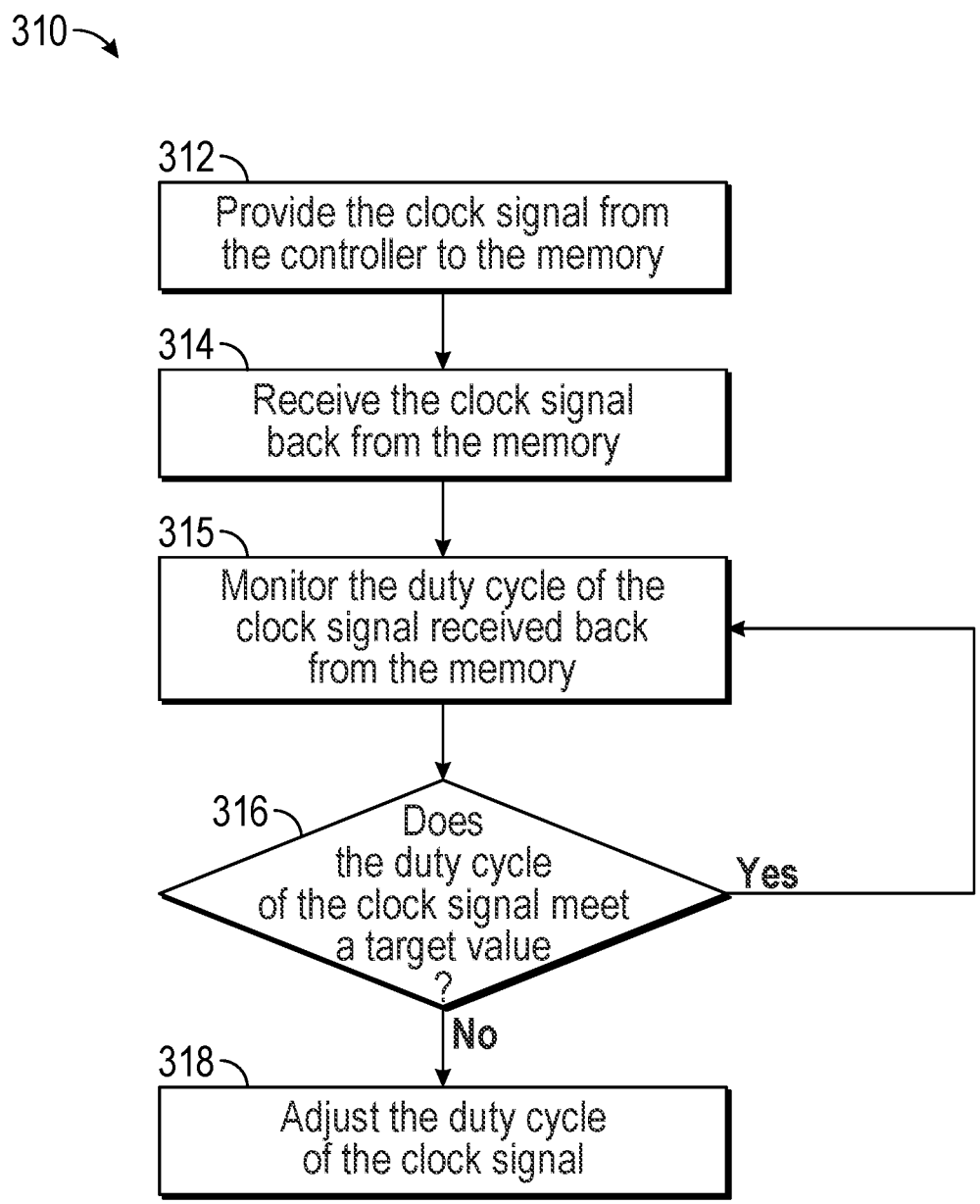
FIG. 3D is a flow chart of another method of an embodiment for dynamically correcting duty cycle.
Figure 3E:
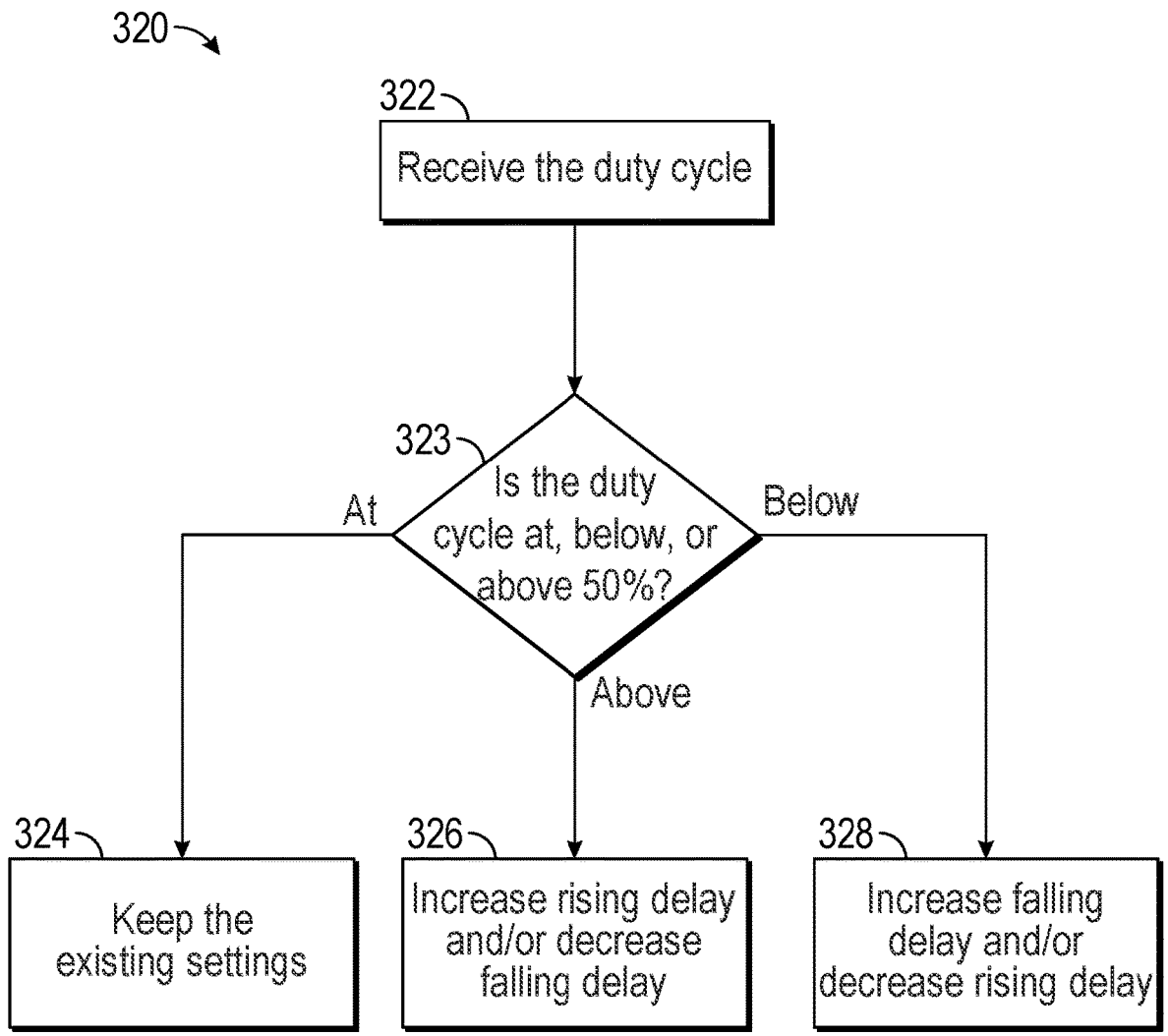
FIG. 3E is a flow chart illustrating operation of control logic in an embodiment for dynamically correcting duty cycle.

For example, FIGS. 3D and 3E are flow charts of a method of an embodiment for dynamically correcting duty cycle. FIGS. 3D and 3E shows example steps that can be performed by the controller 202 (or an external controller or the memory interface 230, separate from or part of the controller 202) configured to coordinate data operations with a memory cell, such as a memory cell of the memory cell structure 242. For example, the controller 202 can fetch, decode, and/or execute one or more instructions for performing various steps of FIGS. 3D and 3E. Various instructions (e.g., for performing one or more steps described herein) can be stored in non-transitory storage medium of controller 202 and/or control logic circuitry of peripheral circuit 252, where the term "non-transitory" does not encompass transitory propagating signals. "Non-transitory" as used herein refers to any media that store data and/or instructions that cause a machine to operate in a specific fashion. Such non-transitory media may comprise non-volatile media and/or volatile media. Non-volatile media includes, for example, optical or magnetic disks. Volatile media includes dynamic memory. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same. As described in detail below, machine-readable storage medium of controller 202 may be encoded with executable instructions, for example, instructions for executing steps of FIGS. 3D and 3E. Non-transitory media is distinct from but may be used in conjunction with transmission media. Transmission media participates in transferring information between non-transitory media. For example, transmission media includes coaxial cables, copper wire and fiber optics, including the wires that comprise bus between the controller 202 and a host. Transmission media can also take the form of acoustic or light waves, such as those generated during radio-wave and infra-red data communications.

As shown in the flow chart 310 in FIG. 3D, in operation, the clock signal is provided from a controller (e.g., controller 202) to the memory (e.g., memory die 104 (block 312). The clock signal is used in the memory to provide the controller with data read out of the memory or data written into the memory. The clock signal is also sent back to the controller on a return clock signal path (block 314), and the duty cycle monitor 212 monitors the duty cycle of the clock signal from the memory (block 315). The duty cycle monitor 212 then determines if the duty cycle of the clock signal returned from the memory meets a target value (block 316) (e.g., within a predefined range of the target value as described above). If the duty cycle meets the target value, the controller continues to monitor the duty cycle for variations. However, if the duty cycle does not meet the target value, the controller adjusts the duty cycle of the clock signal provided to the memory so that the duty cycle of the clock signal returned from the memory better meets the target value (block 318). For example, the duty cycle monitor 212 provides its results to controller 202, which corrects the overall duty cycle of the clock signal, thereby correct for the duty cycle distortions.

FIG. 3E is a flow chart 320 illustrating the operation of the control logic performed by the controller 202. As shown in FIG. 3E, at block 322 the duty cycle is received and the duty cycle monitor 212 determines if it is at, below, or above a target value (e.g., 50%) (block 323). If the duty cycle is at the target value or within a predefined range of the target value, the controller 202 keeps the existing settings (block 324). If the duty cycle is above the target value or above a predefined range of the target value, the controller 202 increases the rising delay and/or decrease the falling delay (block 326). If the duty cycle is below the target value or below a predefined range of the target value, the controller 202 increases the falling delay and/or decrease the rising delay (block 328). These values recited herein are just examples. Thus, instead of 50% as the target value, a different percentage can be used (e.g., 45%, 55%, etc.) or a range can be used (e.g., 49-51%). Similarly, the predefined range of +/−1% is an example, which can be any range (e.g., +/−2%, +/−3%, etc.).

In some embodiments, each of the duty cycle monitor 212, 213 may comprise a phase frequency detector (PFD), a filter/delay control, a digital delay line. In some embodiments, the duty cycle monitors 212, 213 are coupled to a delay tap comparer that compares monitored duty cycles.

It should be noted that not all of the components shown in FIG. 2B may be needed in various embodiments. For example, the duty cycle monitor 213 in the memory die 204 may not be needed when the memory system 200 performs dynamic duty cycle correction during a read operation.

The controller 202 may also be configured to perform a skew correction processes (also referred to herein as a write training process), for example, as described in U.S. application Ser. Nos. 16/017,286 and 17/667,451, the disclosures of which are incorporated herein by reference in their entirety. As used herein, a skew correction process or write training is a process that reduces skew between a clock signal and a data signal. In addition or alternatively, a skew correction process is a process that moves sampling times (e.g., sampling transitions) of a clock signal closer to target sampling times to sample data pulses of a data signal.

Figure 4:
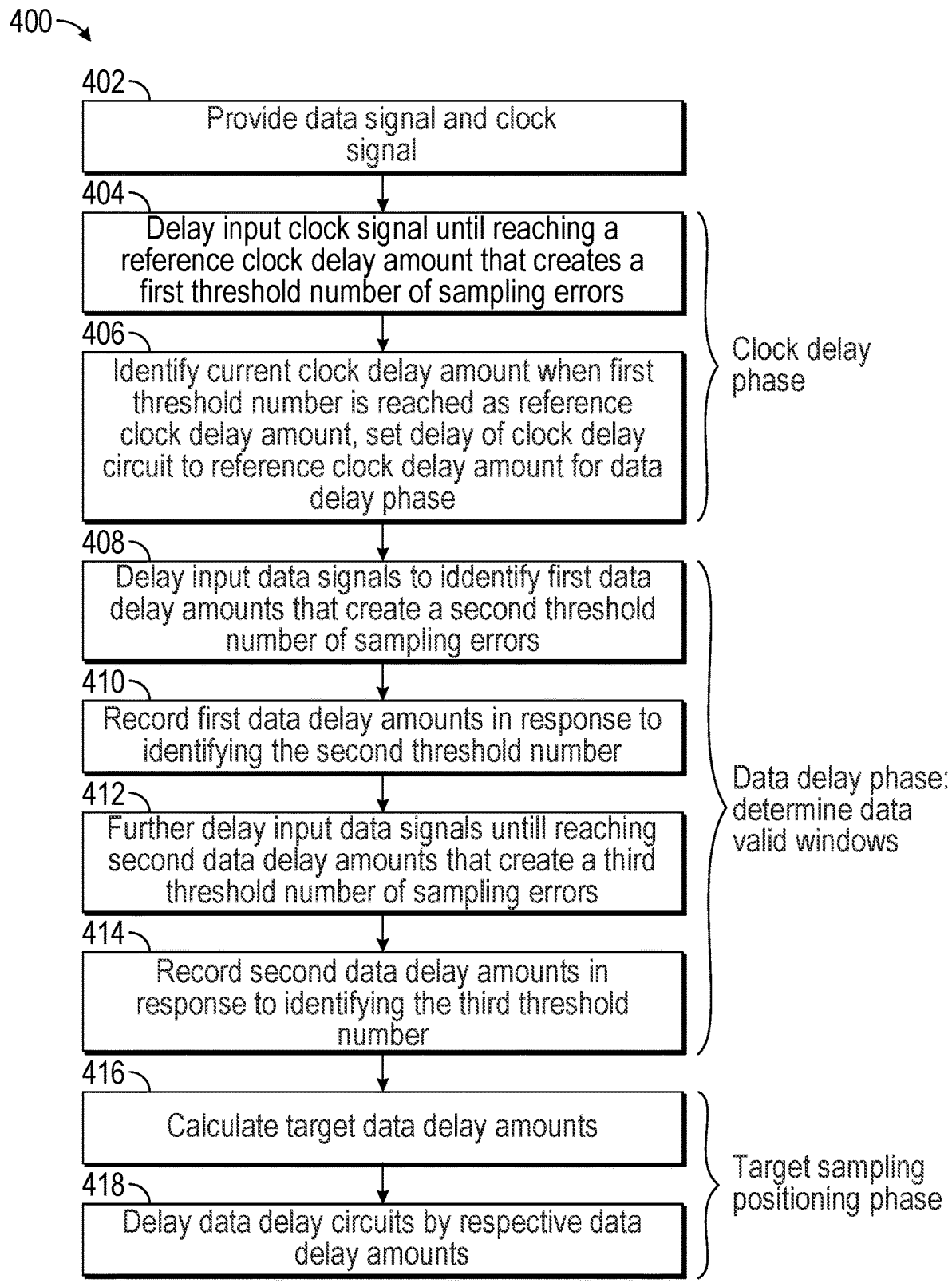
FIG. 4 is a flow chart of an example method of performing a write training process.

FIG. 4 illustrates an example method of performing a skew correction (or write training) process according to embodiments disclosed herein. FIG. 4 shows a flow chart of an example method 400 of performing a skew correction process. FIG. 4 shows example steps that can be performed by the controller 202 (or an external controller or the memory interface 230, separate from or part of the controller 202) configured to coordinate data operations with a memory cell, such as a memory cell of the memory cell structure 242. For example, the controller 202 can fetch, decode, and/or execute one or more instructions for performing various steps of the method 400. Various instructions (e.g., for performing one or more steps described herein) can be stored in non-transitory storage medium of controller 202 and/or control logic circuitry of peripheral circuit 252. As described in detail below, machine-readable storage medium of controller 202 may be encoded with executable instructions, for example, instructions for executing steps of the method 400.

At block 402, the clock signal and data signals are provided. For example, a clock signal is provided from a controller (e.g., controller 202) to the memory (e.g., memory die 104 (block 312). The clock signal is used in the memory to provide the controller with data read out of the memory or data written into the memory. At block 404, the controller 202 may delay the input clock signal until the controller 202 identifies that a number of sampling errors reaches a first threshold number of sampling errors, such as a number of sampling errors set in advance. The first threshold number may indicate a first threshold number of hold violations. The controller 202 increases the clock delays over one or more iterations. During each iteration, the controller 202 may increase the clock delay by one or more increments.

During a given one of the iterations, the controller 202 identifies that the number of sampling errors has reached the first threshold number. At block 406, in response to identification of the first threshold number, the controller 202 may identify a current clock delay amount by which the input clock signal is being delayed. The controller 202 may identify the current clock delay amount as the delay amount that created the first threshold number of sampling errors, and in response, identify the current clock delay amount as the reference clock delay amount. If not set already, the controller 202 may set the clock delay to a reference clock delay amount, and transition to a data delay phase.

The data delay phase may begin at block 408, with the controller 202 identifying first data delay amounts that create a second threshold number of sampling errors, which is generally lower than the first threshold number. The second threshold number may indicate a second threshold number of hold violations. During the data delay phase, the controller 202 may maintain or hold constant the clock delay at the reference clock delay amount. In addition, the controller 202 increase the data delays over one or more iterations. During each iteration, the controller 202 may increase a data delay by one or more increments.

During one or more iterations, the controller 202 identifies that the number of sampling errors has reached the second threshold number. In some example methods, the controller 202 may identify that the second threshold number is reached over a plurality of iterations. For example, where the controller 202 is configured to independently control the delay, the controller 202 may identify that the second threshold number is reached during different iterations.

At block 410, in response to identification of the second threshold number, the controller 202 may identify current data delay amounts that the input data signals DQ is being delayed. The controller 202 may identify the current data delay amounts as the delay amounts that created the second threshold number of sampling errors, and in response, identify the current data delay amounts as the first data delay amounts. A first data delay amount may indicate an upper bound of a data valid window $T_{DVW}$. Accordingly, the first data delay amounts may identify upper bounds of respective data valid windows $T_{DVW}$, and in turn identify minimum delay amounts to set the reference clock delay amount in order to avoid a hold violation. The controller 202 may record the first data delay amounts for later calculation of target data delay amounts.

At block 412, the controller 202 may continue to delay the data signal DQ until identifying second data delay amounts that create a third threshold number of sampling errors, which is generally higher than the second threshold number and less than the first threshold number. As with block 408, the controller 202 may continue to delay the data signal DQ by increasing the data delays over one or more iterations. During each iteration, the controller 202 may increase a data delay by one or more increments.

During one or more iterations, the controller 202 identifies that the number of sampling errors has reached the third threshold number. In some example methods, the controller 202 may identify that the third threshold number is reached over a plurality of iterations. For example, where the controller 202 is configured to independently control the delay of data signals, the controller 202 may identify that the third threshold number is reached for during different iterations.

At block 414, in response to identification of the third threshold number, the controller 202 may identify current data delay amounts the input data signals DQ are delayed. The controller 202 may identify the current data delay amounts as the delay amounts that created the third threshold number of sampling errors, and in response, identify second data delay amounts based on the current data delay amounts. A second data delay amount may indicate a lower bound of a data valid window $T_{DVW}$. Accordingly, the second data delay amounts may identify lower bounds of respective data valid windows $T_{DVW}$, and in turn identify maximum delay amounts to delay respective data signals DQ set to the reference clock delay amount in order to avoid a setup violation. The controller 202 may record the second data delay amounts for later calculation of one or more target data delay amounts.

At block 416, the controller 202 may calculate target data delay amounts based on the first and second data delay amounts. In an example method, the controller 202 may average a given pair of first and second data delay amounts to determine a target delay amount. For a given pair of first and second data delay amounts, the first data delay amount may indicate an upper bound of a data valid window $T_{DVW}$ and the second data delay amount may indicate a lower bound of the data valid window $T_{DVW}$. Accordingly, the average of the first and second data delay amounts may indicate a middle position of the data valid window $T_{DVW}$. In turn, when a given $i^{th}$ input data signal DQ(i) is delayed by the average data delay amount to generate an $i^{th}$ delayed data signal DQ(i)_d, and the input clock signal CLK is delayed by the reference clock delay amount, the $i^{th}$ delayed data signal DQ(i)_d receives sampling transitions of the delayed clock signal CLK_d in target sampling positions. At block 418, the controller 202 may set the delays of the data signals DQ to the target data delay amounts.

The above described skew correction processes assume that respective delayed data signals DQ_d are sampled correctly and delayed clock signals CLK_d have their respective delays set to initial, minimum delay amounts at the beginning of a skew correction process. However, during some skew correction processes, one or more sampling errors may be generated at the beginning of a skew correction process when the delays are set to minimum amounts (e.g., due to PVT variations or other sources). In such events, the above skew correction process may not know whether the sampling errors are the result of a hold violation or a setup violation.

Accordingly, embodiments disclosed herein leverage adjustment of the clock duty cycle by the WDCA/WDCM process described above by integrating the WDCA/WDCM process with the skew correction process. For example, embodiments disclosed herein execute the WDCA/WDCM process to detect the errors in the clock duty cycle and sources thereof, compensate for the changes in the clock duty cycle, and then execute the skew correction process (e.g., write training process) to learn and set the delay of the data signals DQ to the a target data delay amount so to ensure the sampling transition of the clock signal is positioned at an optimal position in the data signal DQ (e.g., at the middle of the data valid window $T_{DVW}$).

Figure 2C:
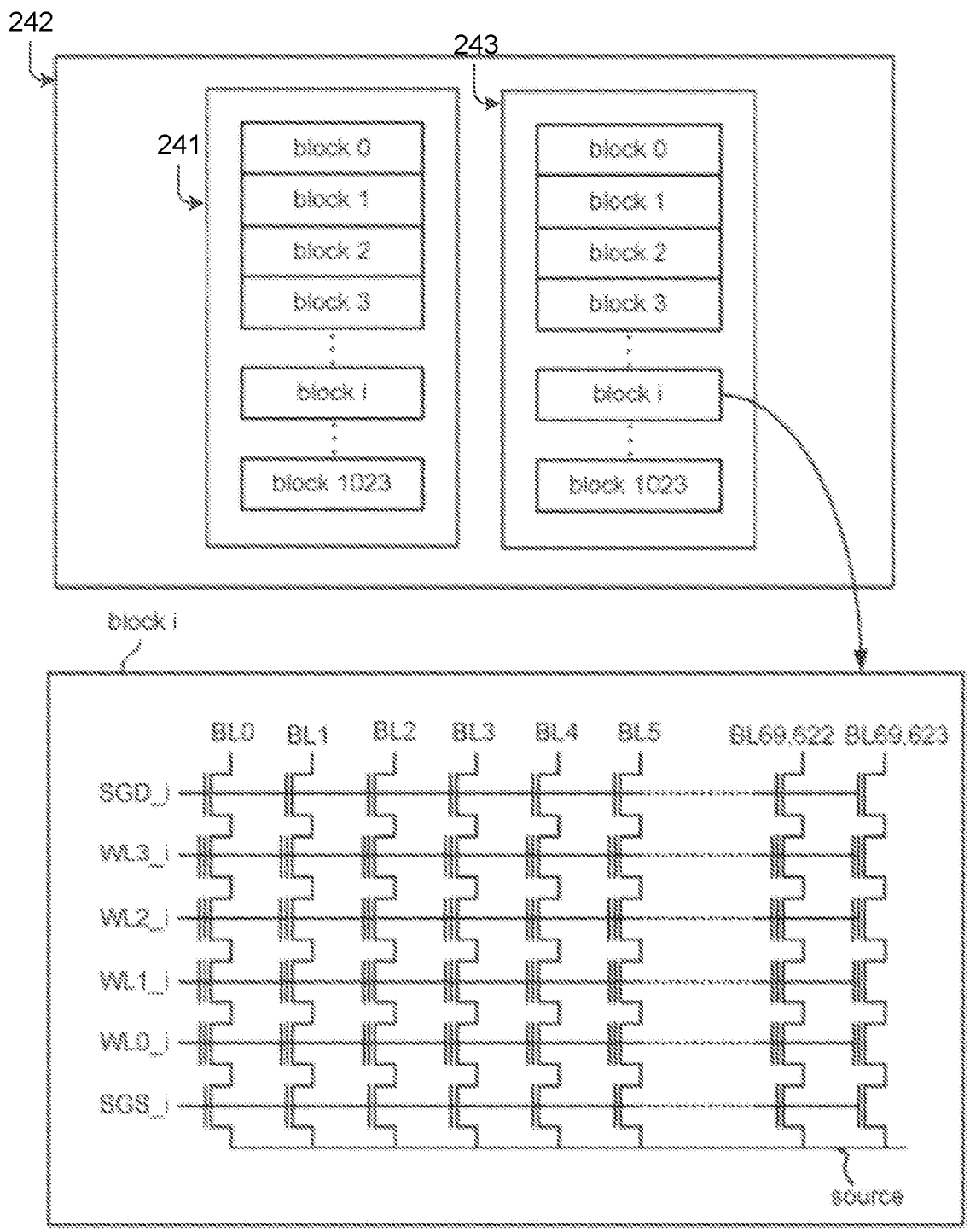
FIG. 2C illustrates a block diagram of an example memory cell structure of FIG. 2B.

FIG. 2C illustrates a block diagram of an example memory cell structure 242. In one embodiment, an array of memory cells is divided into multiple planes. In the example of FIG. 2C, the memory cell structure 242 is divided into two planes: plane 241 and plane 243. In other embodiments, more or less than two planes can be used. In some embodiments, each plane is divided into a number of memory erase blocks (e.g., blocks 0-1023, or another amount). In certain memory technologies (e.g., 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g., MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory cell structure 242. As used herein, a memory erase block is a contiguous set of memory cells that share word lines and bit lines; for example, erase block i of FIG. 2C includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 2C shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 2C shows 69,624 bit lines, a different number of bit lines can also be used.

As described above in connection with blocks 0-1023, in the case that a one or more blocks may be memory erase blocks and/or memory storage units, each memory erase block and/or memory storage unit is typically divided into a number of pages. A page may be a unit of programming/writing and a unit of reading; however, other units of programming can also be used. In this example, the unit of erase is a memory erase block, and the unit of programming and reading is a page. Other units of operation can also be used. Data can be stored/written/programmed, read, or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data into the memory cell structure 242. For example, in one embodiment, the memory storage unit is a page sized to hold 4 KB of data. In certain embodiments, a complete memory storage unit is sized to match the number of physical memory cells across a row of the memory cell structure 242. In one embodiment, an incomplete memory storage unit has fewer physical memory cells than a complete memory storage unit.

In some embodiments, the memory system 200 may compensate for duty errors (and other errors) of the data signal DQ during reference voltage training, for example, via write training (e.g., a skew correction process). However, implementations of write training currently lack methodologies for compensating for errors in the duty cycle of the clock signal DQS/DQSB, as described above. The WDCM/WDCA processes described above may provide such methodologies that may be leveraged to reduce training time and increase performance. Thus, a system controller, such as the controller 202, may employ the WDCA process to adjust the clock signal DQS/DQSB duty cycle to compensate for duty cycle errors and employ write training to compensate for clock signal DQS/DQSB drift and compensate for duty cycle error and drift of the data signal DQ. For example, in various embodiments, a WDCM/WDCA process (such as the process described in connection with FIGS. 3D and 3E) may be executed first to detect and compensate (e.g., correct) errors in the duty cycle of the clock signal DQS/DQSB and then a write training process (such as the process described in connection with FIG. 4) may be executed to detect and compensate for drift in the clock signal DQS/DQSB relative to the data signal DQ.

Figure 2D:
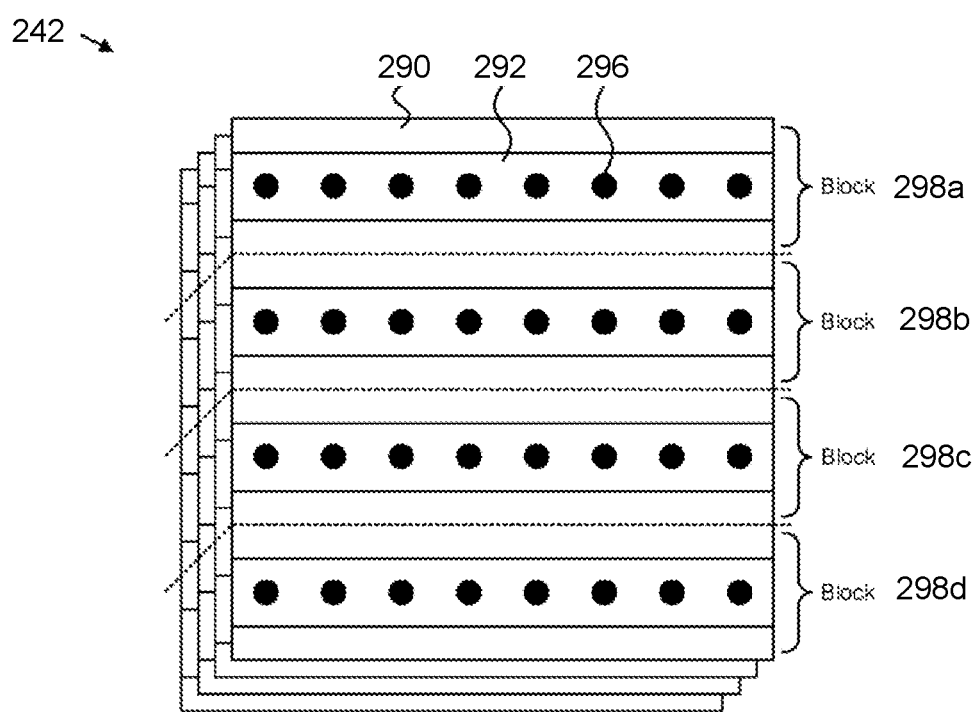
FIG. 2D is a schematic block diagram illustrating one embodiment of a memory cell structure of FIG. 2B.

FIG. 2D depicts one embodiment of a memory cell structure 242. In various embodiments, the memory cell structure 242 may be substantially as described above with regard to FIG. 2B. In the depicted embodiment, the memory cell structure 242 includes word line layers 290, word lines 292, and memory cells 296, organized in blocks 298.

In various embodiments, a memory cell 296 may refer to any component with a physical property that may be altered to store data. For example, a memory cell 296 for NAND memory may be a floating gate transistor, for which the threshold voltage (corresponding to an amount of stored charge on the floating gate) may be altered to store data. Similarly, a memory cell 296 for magnetoresistive memory may be a magnetic tunnel junction, for which a resistance (corresponding to whether two magnetic layers are in parallel or antiparallel states) may be altered to store data. Various types of memory cells 296 for various types of non-volatile memory, such as ReRAM, PCM, MRAM, NAND, and the like, will be clear in view of this disclosure.

In the depicted embodiment, the memory cell structure 242 is a three-dimensional non-volatile memory array. In various embodiments, a three-dimensional non-volatile array may refer to any memory cell structure 242 that includes multiple layers of memory cells 296. Each layer of memory cells 296 may include a plurality of rows and columns of memory cells 296, or another two-dimensional arrangement of memory cells 296.

In various embodiments, word lines 292 may be metal (or other conductive) lines that connect a plurality of memory cells 296. For example, in a two-dimensional array, word lines 292 may connect rows of memory cells 296, and bit lines may connect columns of memory cells 296. In a two-dimensional array, writing may involve applying a write voltage to a word line 292 for a row, while applying program or inhibit voltages to individual bit lines, to control which cells 296 of the row are programmed. Similarly, reading may involve applying a read voltage to a word line 292 for a row, and sensing bit line voltages or currents to determine the state of individual cells 296 in the row. As for a two-dimensional array, reading and writing to memory cells 296 of a three-dimensional memory cell structure 242 may involve transferring a bias voltage (e.g., a read or write voltage) to a word line 292 that connects to multiple cells 296, while addressing individual cells 296 via bit lines. In a certain embodiment, a bit line for a three-dimensional memory cell structure 242 may vertically couple cells 296 in different layers, so that a bit line current or voltage can be sensed above or below the layers. In a further embodiment, local bit lines may extend through the layers to couple cells 296 in different layers, and may be coupled to global bit lines above or below the memory cell structure 242.

In the depicted embodiment, word line layers 290 include the word lines 292. In various embodiments, a layer may refer to a substantially flat structure formed or deposited over a substrate (or over another layer). A word line layer 290, in further embodiments, may refer to a layer that comprises (or is) one or more word lines 292. In certain embodiments, the word line layers 290 may include the word lines 292 and memory cells 296. For example, 3D NAND memory cells 296 may be formed by depositing alternating conductive and insulating layers, forming vertical holes through the layers, depositing charge trap material on the walls of the holes, and forming a central conductor through the holes, so that each conductive layer is a word line 292, and the charge trap material where a hole intersects a word line 292 is a memory cell 296. In another embodiment, a layer of MRAM memory cells 296 may be formed, and then a word line layer 290 may be deposited on top of the layer of memory cells 296, so that word lines 292 are above the memory cells 296.

In one embodiment, a word line layer 290 may be a word line 292. For example, in a certain embodiment, a word line layer 290 may be a conductive layer that connects to multiple memory cells 296. In another embodiment, a word line layer 290 may include multiple word lines 292. For example, in the depicted embodiment, a word line 292 connects to a row of memory cells 296, and each word line layer 290 includes multiple word lines 292, so that a stack of rows forms a block 298. In one embodiment, block 298 a may be addressed using the first word line 292 in each word line layer 290, block 298 b may be addressed using the second word line 292 in each word line layer 290, and so on. In the depicted embodiment, linear word lines 292 are coupled to individual rows of memory cells 296. In another embodiment, however, a first comb-shaped word line 292 may be coupled to odd rows, and a second comb-shaped word line 292 may be coupled to even rows. Various configurations of word lines 292 within a word line layer 290 will be clear in view of this disclosure.

In various embodiments, word lines 292 and bit lines are coupled to peripheral circuitry (not shown in FIG. 2D) for reading and writing data of the memory cells 296 and writing data to the memory cells 296. In general, in various embodiments, peripheral circuitry may include control components that control word line voltages and bit line voltages, latches for temporarily storing data of a read operation or a write operation, sense amplifiers to detect and amplify bit line voltages or currents, and the like.

Figure 5:
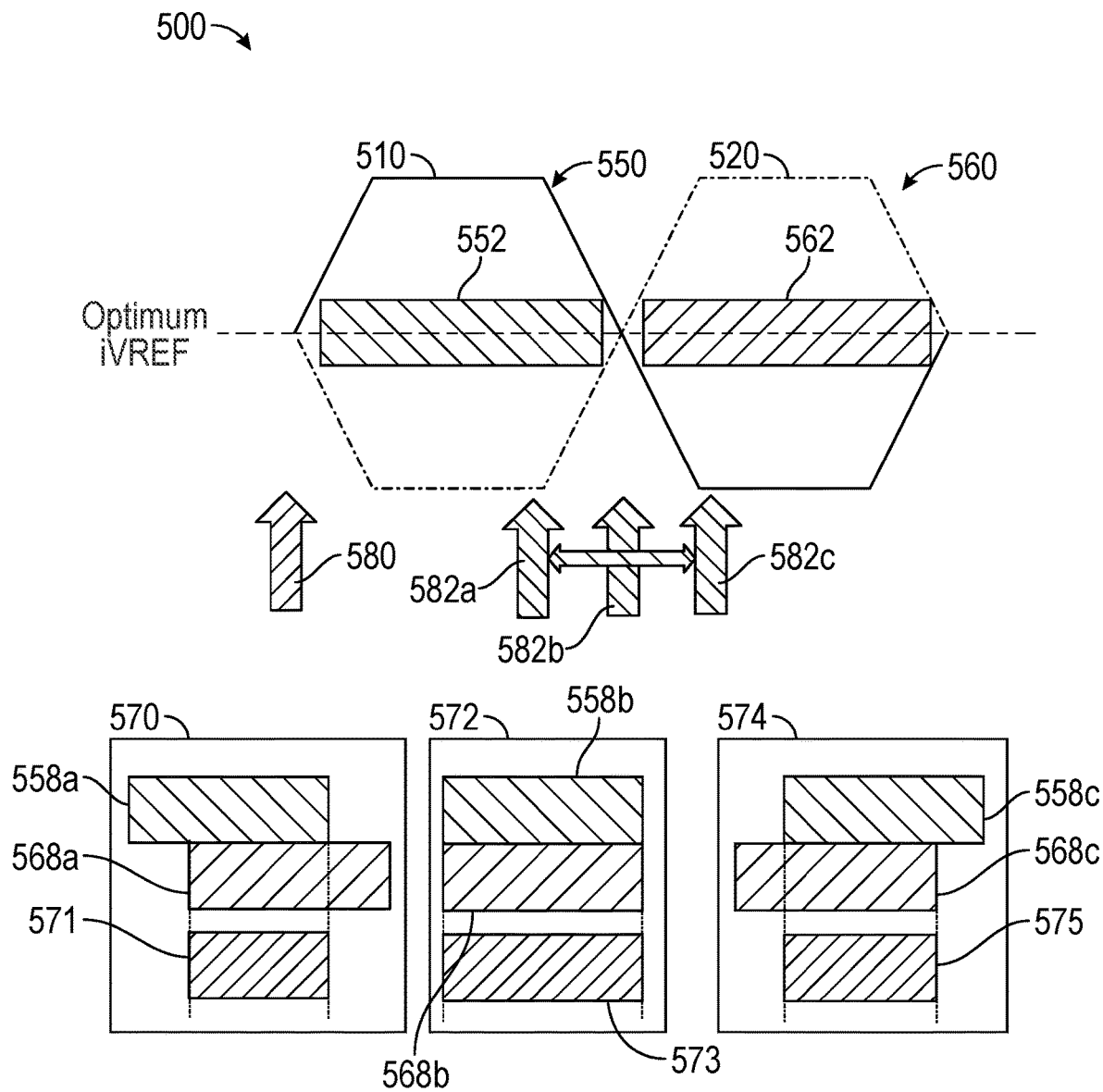
FIG. 5 is a representation of a data eye diagram of an example arrangement of data windows or eyes formed by a data signal in a memory system, according to example embodiments described in the present disclosure.

FIG. 5 is a representation of a data eye diagram 500 of an example arrangement of data windows, or eyes, 550 and 560 formed by a data signal DQ in a memory system, such as the memory system 200 of FIGS. 2A-2E, according to example embodiments described in the present disclosure. In some embodiments, the data eye diagram 500 can be analyzed by a controller, such as the controller 202, using a common window detection methodology. The common window detection methodology may use a DDR clock signal scheme. The data eye diagram 500 includes the data windows 550 and 560 and timing indicators shown as arrows 580 and 582a-582c (collectively referred to as timing indicator 582) corresponding to a clock signal CLK duty cycle. FIG. 5 further depicts data strobe and passing window overlap diagrams 570, 572, and 574 that depicts overlaps of data window operations based on different clock signal timings DQS/DQSB relative to the data signal DQ.

The data windows 550 and 560 may include even data block 552 and odd data block 562, respectively. The even and odd data blocks (e.g., bytes) 552/562 may represent bits of a data signal DQ(i) for a data operation during the corresponding data windows 550/560. Each data window 550 and 560 is defined by an input data signal 510 and a logical inverse of the input data signal, inverse input data signal 520. As described above, the input data signal 510 (indicative of data blocks 552 and 562) performs a rising transition or a falling transition to transition between consecutive data pulses. The data operation, such as a data read or write, may be successful or may fail based at least in part on when the clock signal DQS/DQSB is received.

The duty cycle of the clock signal DQS/DQSB is shown with arrows 580 and 582. The arrow 580 indicates a beginning time of the setup time (e.g., tDS in connection with FIGS. 1E and 1F) of the duty cycle of the clock signal DQS/DQSB based on detecting a level of the data pulse for data block 552 is stable. Arrows 582a-582c indicate different respective sampling transitions (e.g., clock events) of the duty cycle of the clock signal DQS/DQSB. The multiple arrows 582a-582c indicate how the embodiments disclosed herein can adjust the sampling transition of duty cycle of the clock signal DQS/DQSB to shorten or lengthen the duty of the clock signal DQS/DQSB. For example, a WDCA process may be performed to detect and correct for errors in the clock signal duty cycle by lengthening or shortening the duty cycle and the write training process may be used to algin the sampling transition of the duty cycle of the clock signal with the valid data window. As shown in FIG. 5, the arrow 582b identifies the sampling transition of the duty cycle of the clock signal DQS/DQSB that generally aligns with the center of the valid data window of the data signal DQ. The arrow 582a identifies the sampling transition of duty cycle of the clock signal DQS/DQSB that is advanced by the write training based on the WDCA shortening the duty cycle of the clock signal DQS/DQSB, while the arrow 582c identifies the sampling transition of the duty cycle that is delayed by the write training based on the WDCA lengthening the duty cycle of the clock signal DQS/DQSB. The adjustment by the write training process is represented by a horizontal arrow 584 in proximity to the arrows 582a-582c.

Receiving the clock signal DQS/DQSB at a center of the data windows 550/560, and the center of the combined even and odd data blocks 552/562, respectively, may be optimal for triggering successful data operations upon the data signal DQ and the data blocks 552/562, as described above. In some embodiments, an optimal timing of the clock signal DQS/DQSB is a timing that is substantially centered in the data blocks 552/562. When the clock signal DQS/DQSB is substantially centered in the data blocks 552/562, setup and hold times of the data blocks 552/562 are maximized and substantially equal in duration. In this case, substantially equal may refer to a maximum data shmoo window, where a data shmoo window is a sampling result with a DQS/DQSB sweep representing a horizontal eye opening window.

As described previously, a setup time may correspond to an amount of time that data in the data block 552/562 is stable before a rising edge of the clock signal CLK is received, while a hold time may correspond to an amount of time that data in the data block 552/562 is stable after the rising edge of the clock signal DQS/DQSB is received. Maximizing both the setup and hold times may improve data operations because the data in the data window is more likely to be stable when the data operation is triggered by a clock signal DQS/DQSB that is substantially centered in the data block 552/562. If the clock signal DQS/DQSB is not optimized (e.g., not substantially centered in the data block 552/562), then one of the setup and hold times may be shorter than the other and potentially be too short to ensure a successful data operation and resulting in setup and/or hold violations. Thus, an error may occur and the data in the data block 552/562 may not be available for the data operation if the clock signal DQS/DQSB is not received at an appropriate time. This timing can be impacted by changes to the duty cycle of the clock signal DQS/DQSB as well as PVT variances in a clock path of the clock signal DQS/DQSB. In some embodiments, the analysis of whether the clock signal DQS/DQSB is received at a center of the data block 552/562 is performed for the even/odd data blocks together as opposed to individually by the controller 202. More specifically, the controller may analyze passing windows (e.g., data valid window) for both of the data blocks 552/562 relative to the clock signal DQS/DQSB together as a common window. Alternatively, the controller 202 may analyze passing windows for the even and odd data blocks 552/562 separately, which may enable the controller 202 to identify different and/or additional details, described further below with reference to FIG. 6.

In some embodiments, the write training process introduced above is used to train a memory interface, such as the memory interface 230 of FIG. 2B. Training of the memory interface can be used to identify the first data windows 550 and the second data window 560 in which the even and odd data blocks 552 and 562 are shown, respectively. This training may further coordinate timing of the clock signal DQS in a middle of the even data block 552 and timing of the clock signal DQSB in a middle of the odd data block 562, which may correspond to optimal or ideal timing of the clock signal DQS/DQSB relative to the data signal DQ and the data windows 550/560. More specifically, write training by the controller may target placing a rising edge of the clock signal DQS in the data block 552 and placing a rising edge of the clock signal DQSB in the data block 562. When the rising edges of the clock signal DQS/DQSB are placed in the middle of the corresponding data block, this may be an ideal timing of the clock signal DQS/DQSB, at which point the setup and hold times may be substantially maximized and equal in duration. Any shift of the clock signal DQS/DQSB with respect to the data blocks 552/562 from the ideal timing may result in a change to the setup and hold times.

In operation, the write training process may comprise placing the sampling transition of the clock signal DQS/DQSB at a first location or timing within the data block 552/562 and determining whether the setup and hold times for the data block 552/562 are maximized, as described above in connection with FIG. 4. The write training process may repeat this for various timings increments in the data block 552/562 and then compare setup and hold times for each timing. The write training may select the timing that maximizes the setup and hold times, which may substantially center the sampling transition of the clock signal DQS/DQSB in the data block 552/562. For example, in various embodiments, the write training may place the sampling transition of the clock signal DQS/DQSB at the center of both data windows 550 and 560 (e.g., in the center between the data windows 550/560). Thus, the write training process may shift or place the clock signal DQS/DQSB so that the flip flop of the data signal DQ forming the data windows 550/560 and the data blocks 552/562 have the maximized setup and hold times.

For example, in write training process, the controller may place the clock signal DQS/DQSB at a farthest left timing in the data block 552/562. The controller may then execute a data operation and determine lengths of the setup and hold times. The controller will then shift the clock signal DQS/DQSB to a timing to the right of the farthest left timing, execute another data operation at the new timing, and determine lengths of the setup and hold times at the new timing. The controller may incrementally repeat this shift to the right and data operation process until the lengths of the setup and hold times for all timings of the data block 552/562 have been determined. The controller 202 may then identify the ideal timing for the clock signal DQS/DQSB based on which timing of the data block 552/562 provides the setup and hold times that are maximized from all of the timing and setup and hold time associations.

As described above, the controller 202 uses WDCA to adjust the duty cycle for the clock signal DQS/DQSB and then uses write training to identify the ideal timing for the adjusted clock signal DQS/DQSB as it relates to the data block 552/562. Identifying the ideal timing may comprise the controller shifting the clock signal DQS/DQSB to account for any delays or other drift experienced by one or more of the clock signal DQS/DQSB. Additionally, because the writing training associates the clock signal DQS/DQSB with the data signal DQ the write training also accounts for delays, drift, or other changes that the data signal DQ may experience, such as changes to the data signal DQ duty cycle, PVT variances, and so forth. However, the write training may not be able to compensate for variations in the duty cycle of the clock signal DQS/DQSB. Thus, the controller 202 integrates the WDCA process with the write training process to gain benefits of compensating for variations in the duty cycle of the clock signal DQS/DQSB (with the WDCA process) as well as benefits of compensating for changes to the data signal DQ (with the write training process).

Under such integration, the controller 202 may adjust the duty cycle for the clock signal DQS/DQSB and then perform write training to identify ideal timing for the adjusted clock signal DQS/DQSB. For example, controller 202 may detect a maximum data window (e.g., data window 550 and/or data window 560) via write training. Write training provides a sampling pass window. Thus, if the duty cycle correction is executed properly, the sampling window also is maximized. This process of adjusting the duty cycle for the clock signal DQS/DQSB and then performing write training for the adjusted clock signal DQS/DQSB may be repeated for all WDCA bit codes, etc. By performing the WDCA and write training processes in this integrated manner, the controller may identify and compensate for both the compensated clock signal DQS/DQSB duty cycle as well as the appropriate clock signal timing for the clock signal DQS/DQSB in relation to the data block 552/562, compensating for any changes of the data signal DQ that creates the data block 552/562.

As introduced above, PVT and other variations can cause changes in a delay and/or the duty cycle of the clock signal DQS/DQSB and aspects of the data signal DQ, such as delays, duty cycle, and so forth. For example, setup and hold requirements of the data signal DQ may change due to PVT variations, such as the setup hold time increasing and the hold time decreasing following a temperature variation. The WDCA process may compensate for the effects such variations have on the duty cycle of the clock signal DQS/DQSB, while the write training process may compensate for changes to the aspects of the data signal DQ and delays in the clock signal DQS/DQSB.

The passing window overlap diagrams 570, 572, and 574 show example overlaps 571, 573, and 575 of the valid data window 558a, 558b, and 558c for odd byte blocks 552 and the corresponding valid data windows 568a, 568b, and 568c for even byte blocks 562 that may result from shifts in sampling transitions 582a-582c in the clock signal DQS/DQSB due to execution of the embodiments disclosed herein. Specifically, the overlap diagram 570 depicts an example of where the clock signal DQS is received early (e.g., down duty cycle having sampling transition 582a) relative to the data block 552 as compared to the clock signal DQSB relative to the data block 562, which correspond to passing windows. For example, the duty cycle of clock signal DQS has a sampling transition 582a that is earlier than the ideal timing of the data block 552, while the clock signal DQSB is received at the ideal timing of the data block 562. As such, the sampling (e.g., passing window 558a) of data block 552 "begins" earlier than the passing window 568a for the data block 562, and a resulting overlap 571 of the passing windows 558a and 568a is shown corresponding to a period for which the sampling of data block 552 overlaps with the sampling of data block 562. The overlap diagram 572 depicts an example of where the sampling transition of the duty cycle of the clock signal DQS is received at the same time relative to the data block 552 as compared to the clock signal DQSB relative to the data block 562. For example, the sampling transition of the duty cycle of clock signal DQS is received at the ideal timing of the data block 552 and the sampling transition of the duty cycle of clock signal DQSB also is received at the ideal timing of the data block 562 (e.g., at sampling transition 582b). As such, the passing window 558b of data block 552 "begins" at the same time as the passing window 568b of data block 562, and a resulting overlap 573 is shown corresponding to a period for which passing windows 558c of the data block 552 overlaps with that of the data block 562. The resulting overlap 573 is larger than the overlap 571 due to the alignment of the timings of the clock signal DQS/DQSB relative to the data blocks 552/562. The overlap diagram 574 depicts an example of where the sampling transition of the duty cycle for clock signal DQS is received late relative to the data block 552 as compared to the clock signal DQSB relative to the data block 562. For example, the clock signal DQS is received later than the ideal timing of the data block 552 (e.g., an up duty cycle having sampling transition 582c), while the clock signal DQSB is received at the ideal timing of the data block 562. As such, the passing window 558c of data block 552 "begins" later than the passing window 568c of data block 562, and a resulting overlap 575 is shown corresponding to a period for which the passing window 558c of data block 552 overlaps with the that of data block 562. The resulting overlap 575 is shorter than the overlap 573 due to the misalignment of the timings of the clock signal DQS/DQSB relative to the data blocks 552/562.

In summary, conventional systems that do not integrate WDCA with the write training may be unable to find optimum points for both the clock signals DQS/DQSB duty cycle and the delay shift of the clock signal relative to the data signal DQ. Thus, such conventional systems may be unable to fully compensate for delays to either or both of the clock signal DQS/DQSB and the data signal DQ as well as changes to the duty cycles of either or both of the clock signals DQS/DQSB and the data signal DQ. Thus, these convention systems may not be able maximize passing windows for data operations. Pursuant to example embodiments described herein, the controller 202 may perform WDCA and write training in an integrated manner. By this integration, the controller 202 adjusts the duty cycle of the clock signals DQS/DQSB and performs write training to identify the ideal timing for the clock signals DQS/DQSB for the adjusted duty cycle of the clock signals DQS/DQSB. The controller 202 then repeats this process for other clock signals DQS/DQSB duty cycle adjustments, where such adjustments may be made for each code that defines the number of times the clock signals DQS/DQSB duty cycle is to be adjusted. This integration enables the controller 202 to ensure that the clock signals DQS/DQSB have the proper duty cycle (from the repeated clock signals DQS/DQSB duty cycle adjustment) and are placed in the appropriate location relative to the data blocks 552/562 (from the write training applied to each adjusted duty cycle) to obtain passing windows (i.e., windows that provide successful data operations) having durations that maximize the overlap between the passing downs of the even and odd data blocks.

Figure 6:
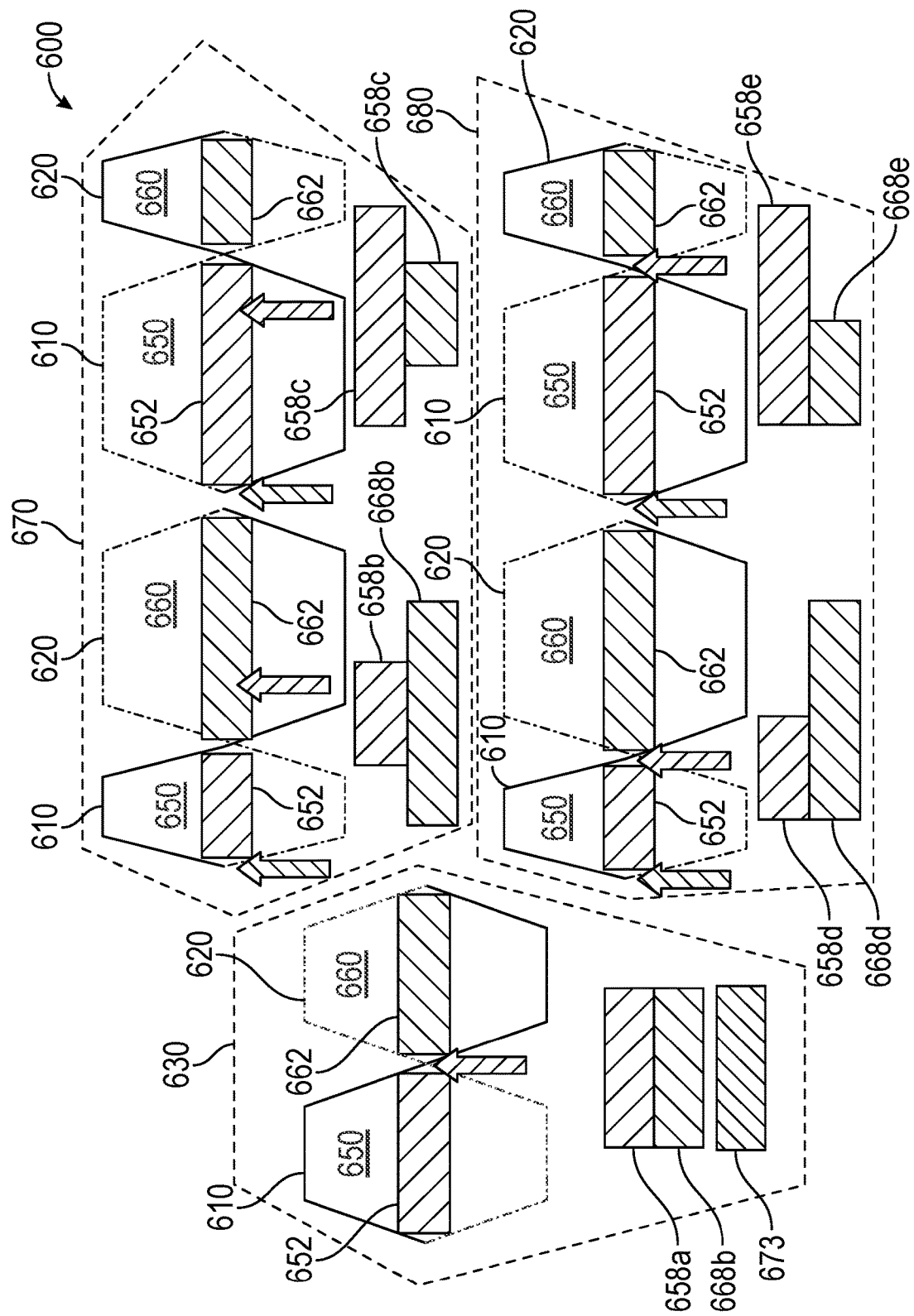
FIG. 6 depicts representations of a data eye diagram of example arrangements of data windows or eyes formed by a data signal in a memory system, according to example embodiments described in the present disclosure.

FIG. 6 depicts representations of a data eye diagrams of example arrangements of data windows, or eyes, 650 and 660 formed by a data signal DQ in a memory system, such as the memory system 200 of FIGS. 2A-2E, according to example embodiments described in the present disclosure. The different representations depict how the WDCA and write training can be applied to the data windows 650 and 660 following separate detection of errors in the data windows 650/660 individually. For example, the data eye diagram 600 shows how a controller, such as the controller 202, detects errors in the data windows 650/660 in combination (e.g., the errors are detected and compensated for to maximize overlap between data blocks 652/662). The data eye diagram 600 is shown in an ideal arrangement 630; two arrangements 670 with no clock signal DQS/DQSB duty cycle error but with data signal DQ duty cycle error; and two arrangements 680 with clock signal DQS/DQSB duty cycle synchronization error and data signal DQ duty cycle error.

The data windows 650 and 660 may include even data block 652 and odd data block 662, respectively. The even and odd data blocks (e.g., bytes) 652/662 may represent bits of a data signal DQ(i) for a data operation during the corresponding data windows 650/660. Each data window 650 and 660 is defined by an input data signal 610 and a logical inverse of the input data signal, inverse input data signal 620. As described above, the input data signal 610 (indicative of data blocks 652 and 662) performs a rising transition or a falling transition to transition between consecutive data pulses.

In some embodiments, the controller 202 analyzes the passing windows of the data blocks 652/662 with respect to the clock signal DQS/DQSB independently or individually of each other. For example, using the process described above in connection with FIG. 5, data window 650 may be analyzed with respect to the clock signal DQS to detect errors in clock signal DQS duty cycle and shift the sampling transition time of the clock signal DQS relative to the middle of a valid data window for the odd data block 652. Separately and independently, data window 660 may be analyzed with respect to the clock signal DQSB to detect errors in clock signal DQSB duty cycle, separate from those (if any) in the clock signal DQS, and shift the sampling transition time of the clock signal DQSB relative to the middle of a valid data window for the even data block 662. Alternatively, the controller may analyze the passing windows for the even and odd data blocks 552/562 together, which may enable the controller to identify different and/or additional details, described further above with reference to FIG. 5. Thus, the controller may perform the analysis of whether the clock signal DQS/DQSB is received at a center of the data block 652/662 for the even block 652 separate from the odd data block 662 as opposed to together.

The ideal arrangement 630 shows an embodiment in which the controller determines that the data windows 650 and 660 comprise data blocks 652/662 that are substantially the same length or duration and, thus, have similar passing windows 658 and 668 such that the overlap 673 is maximized, as described in connection with FIG. 5. This means that the data blocks 652/662 in the ideal, or optimal arrangement 630 have the same length passing windows during which the controller may place the clock signal DQS/DQSB at an ideal timing substantially at the center of the data blocks 652/662.

In some embodiments, if the controller knows the start and end points of the passing windows for each of the even and odd windows 652/662, the controller may identify details regarding the error being suffered.

In some embodiments, the controller may identify a duty cycle error in the duty cycle for the data signal DQ, for example, based on executing a write training process. For example, as shown in the arrangement 670, the controller may determine that the even data block 652 has a different length than the odd data block 662 but that the duty cycle of the clock signal DQS/DQSB does not comprise an error. The controller may identify the lack of duty cycle error for the clock signal DQS/DQSB, for example, by executing a WDCA/WDCM process, such that the passing windows 658b and 668b and passing windows 658c and 668c of data blocks 652/662, respectively, are aligned or centered. This shows that the passing windows of data blocks 652/662, though having different lengths, are centered. In some embodiments, the controller may determine that the data blocks 652/662 are of different length due to an error generating the duty cycle for the data signal DQ based on evaluating the lengths of each of the data block 652 and the data block 662. Based on the different lengths, the controller may identify a source of the duty cycle error, for example, a data signal generator, and an amount of error, and so forth, which the controller may further use to compensate for the duty cycle error of the data signal DQ. If the duty cycle is corrected, then the sampling window for data block 662 is maximized. Thus, if not maximized then the controller may detect that the duty cycle contains an error.

For example, in the arrangement 620, the controller may determine that the even data block 652 is shorter than the odd data block 662 in a first instance (on the left) of the arrangement 670, which may suggest a first error and first course of correction for the error. Similarly, the controller may determine that, for a second instance (on the right) of the arrangement 670, the odd data block 662 is shorter than the even data block 652, which may suggest a second error and second course of correction for the second error.

In some embodiments, the controller may identify both a duty cycle error in the duty cycle for the data signal DQ as well as an error in the timing/synchronization of the clock signal DQS/DQSB. For example, as shown in the arrangement 680, the controller may determine that the even data block 652 has a different length than the odd data block 662 and that the overlap of the passing window shows that the duty cycle of the clock signal DQS/DQSB lacks synchronization between the data blocks 652/662. The controller may identify the duty cycle error for the clock signal DQS/DQSB, for example, by executing a WDCA/WDCM process, such that the passing windows 658d and 668d and passing windows 658e and 668e of data blocks 652/662 failing to be centered in alignment. This shows that the data blocks 652/662 have different lengths and begin at the same time but are not centered. In some embodiments, the controller may determine that the data blocks 652/662 are of different length due to an error generating the duty cycle for the data signal DQ based on evaluating the lengths of each of the data block 652 and the data block 662. Based on the different lengths, the controller may identify a source of the duty cycle error, for example, a data signal generator, and an amount of error, and so forth, which the controller may further use to compensate for the duty cycle error of the data signal DQ. The controller may further determine a timing drift in the clock signal DQS/DQSB because the data blocks 652/662 are not center aligned in the alignment 632a/632b. The controller can use this determined timing drift to use write training to place the clock signal DQS/DQSB at ideal timings relative to the data blocks 652/662.

For example, in the arrangement 630, the controller may determine that the even data block 652 is longer than the odd data block 662 in a first instance (on the left) of the arrangement 630, which may suggest a third error and third course of correction for the third error. Similarly, the controller may determine that, for a second instance (on the right) of the arrangement 630, the odd data block 662 is longer than the even data block 652, which may suggest a fourth error and fourth course of correction for the fourth error.

Based on being able to detect the even and odd passing windows separately and determine corresponding errors, the controller may adjust the data signal DQ duty cycle to maximize the even and odd passing windows (e.g., make them the same, or substantially the same, length, as shown in the arrangement 610).

Figure 7:
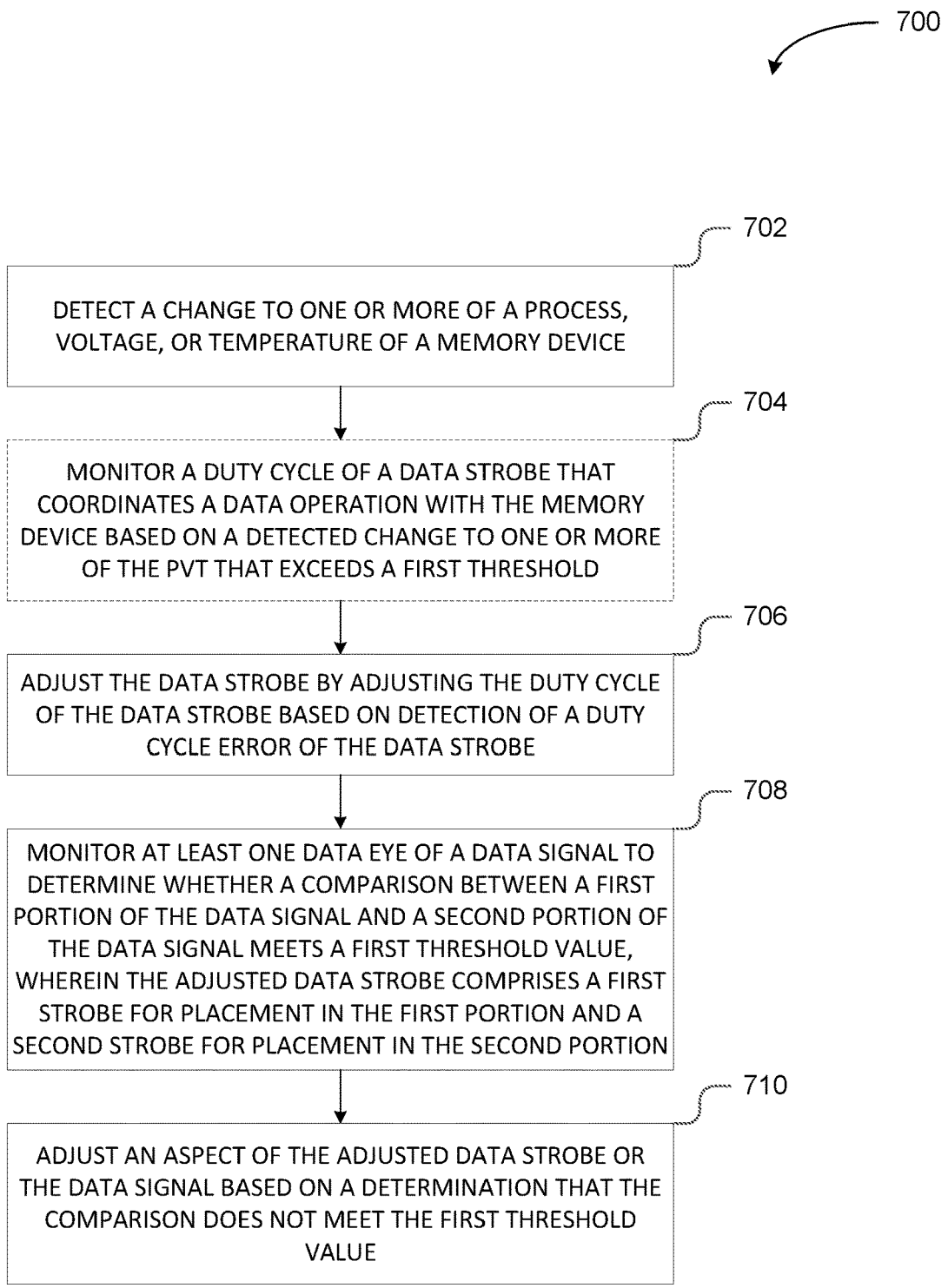
FIG. 7 is a flow chart of an example method for reducing detection error and duty cycle error according to embodiments described in the present disclosure.

FIG. 7 is a flow chart of an example method 700 for reducing detection error and duty cycle error according to embodiments described in the present disclosure. FIG. 7 shows example steps that can be performed by the controller 202 (or an external controller or the memory interface 230, separate from or part of the controller 202) configured to coordinate data operations with a memory cell, such as a memory cell of the memory cell structure 242. For example, the controller 202 can fetch, decode, and/or execute one or more instructions for performing various steps of the method 700. Various instructions (e.g., for performing one or more steps described herein) can be stored in non-transitory storage medium of controller 202 and/or control logic circuitry of peripheral circuit 252, where the term "non-transitory" does not encompass transitory propagating signals. "Non-transitory" as used herein refers to any media that store data and/or instructions that cause a machine to operate in a specific fashion. Such non-transitory media may comprise non-volatile media and/or volatile media. Non-volatile media includes, for example, optical or magnetic disks. Volatile media includes dynamic memory. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same. As described in detail below, machine-readable storage medium of controller 202 may be encoded with executable instructions, for example, instructions for executing steps of the method 700. Non-transitory media is distinct from but may be used in conjunction with transmission media. Transmission media participates in transferring information between non-transitory media. For example, transmission media includes coaxial cables, copper wire and fiber optics, including the wires that comprise bus between the controller 202 and a host. Transmission media can also take the form of acoustic or light waves, such as those generated during radio-wave and infra-red data communications.

The method 700 may comprise a method of coordinating data operations with a data signal of a memory cell, such as a memory cell of the memory cell structure 242 of the memory die 204. Operations that make up the method 700 can include an operation 702 at which the controller detects a change to one or more of a process, voltage, or temperature (e.g., PVT variations) of a memory device. Detecting the PVT variation may comprise employing a sensor or signal monitor to monitor environmental aspects of the memory die 204 and/or monitoring a process of the memory die 204, associated signals, duty cycles, and so forth. In some embodiments, though not explicitly shown, detecting the PVT change may comprise comparing the PVT change to a threshold change amount to determine when a change is large enough or sufficient to warrant further steps. In an example, the threshold change amount may be, for example, +/−3%, which may be variation permitted within an internal path of a memory system (e.g. memory system 700). As another example, alone or in combination with the preceding threshold change amount, some implementations of memory system 200 permits a variation in the duty cycle of a data strobe (e.g., clock signal DQS/DQSB), which may be up to +/−5% as a threshold change amount.

At step 706 of the method 700, the controller may adjust the data strobe by adjusting the duty cycle of the data strobe that coordinates the data operation, such as a write, read, erase, or other operation, with the memory device based on detection of a change of a duty cycle for the data strobe. The data strobe may correspond to the clock signal DQS/DQSB described above. Adjusting the duty cycle of the data strobe (e.g., of the clock signal DQS/DQSB) may correspond to applying WDCA, such as described above in connection with FIGS. 2A, 3A-3E, and 5-6, to adjust the duty cycle, as described above. In some embodiments, the adjustment of the duty cycle is only performed if the detected PVT change meets or exceeds the threshold change amount. In some embodiments, the adjustment of the duty cycle of the clock signal DQS/DQSB is performed after monitoring the duty cycle of the clock signal DQS/DQSB and identify a duty cycle error, for example, by the WDCM, for example, at optional block 704 as described below.

At step 708 of the method 700, the controller monitors at least one data eye of a data signal to determine whether a comparison between a first portion of the data signal and a second portion of the data signal meets a first threshold value, wherein the adjusted data strobe comprises a first strobe for placement in the first portion and a second strobe for placement in the second portion. In some embodiments, the data signal corresponds to the data signal DQ introduced above. The monitoring at block 708 may be performed as described above in connection with FIGS. 2A, 2B, and 4-6. In some embodiments, the monitoring of the at least one data eye corresponds to the controller analyzing the even and odd data blocks of successive data windows or eyes to determine whether the passing windows of the data blocks are aligned. For example, at block 706 the controller may determine whether the sampling transition of the clock signal DQS/ DQSB for the two data blocks, adjusted at block 706, are appropriately located within the valid data window of each data block (e.g., in the middle of the valid data window), as introduced above with relation to FIG. 5. Thus, the controller may determine the comparison by monitoring the data blocks together. In some embodiments, the monitoring corresponds to the controller individually monitoring the sampling transition of the clock signal DQS and DQSB (as adjusted in block 706) for each of the even and odd data blocks, respectively, and determining whether the clock signal DQS/DQSB for each data block is aligned, as introduced above with relation to FIG. 6. Thus, the controller may determine the comparison by monitoring the data blocks independently. In some embodiments, the first threshold value may correspond to an amount of overlap (or lack thereof) with respect to the comparison introduced above in FIG. 5 (e.g., maximizing the amount of overlap) or an amount of difference, for example, between data blocks when the even and odd data blocks have different sizes or lengths, as introduced above in FIG. 6.

At step 710 of the method 700, the controller adjusts an aspect of the adjusted data strobe or the data signal based on a determination that the comparison does not meet the first threshold value. The adjusting at block 710 may be performed as described above in connection with FIGS. 2A, 2B, and 4-6. In some embodiments, the adjustment of the aspect of the data strobe corresponds to a shift of the timing of the clock signal DQS/DQSB in response to corresponding drift in the clock signal DQS/DQSB. With respect to the data signal, the adjustment may be an adjustment to one of the duty cycle, timing, and so forth.

In some embodiments, optional block 704 may be included where the controller monitors the duty cycle of the data strobe based on the detected change to one or more of the PVT that exceeds a second threshold. The second threshold may correspond to a threshold change amount. Monitoring the duty cycle of the data strobe may correspond to applying WDCM to monitor the duty cycle as described above, such as in connection with FIGS. 2A, 3A-3E, and 5-6. In some embodiments, the monitoring of the duty cycle is only performed responsive to the detected PVT change meeting or exceeding the threshold change amount.

In some embodiments, monitoring at least one data eye of a data signal to determine whether a comparison between a first portion of the data signal and a second portion of the data signal meets the first threshold value comprises comparing an overlap of a first block of the first portion and a second block of the second portion to the first threshold value to determine that the overlap meets a threshold amount requirement. This corresponds to the common window detection introduced above with respect to FIG. 5.

In some embodiments, adjusting an aspect of the data strobe or the data signal based on a determination that the comparison does not meet the first threshold value comprises shifting the first clock signal DQS and/or the second clock signal DQSB to the left or right with respect to time relative to the first portion (e.g., the even block) and/or the second portion (e.g., the odd block), respectively, when the overlap between the even block and the odd block is less than the threshold amount requirement. In some embodiments, the threshold amount requirement corresponds to a minimum amount of overlap between the even and odd blocks. In some embodiments, the threshold amount requirement corresponds to a minimum amount of overlap needed to maximize the overlap of the passing windows.

In some embodiments, monitoring at least one data eye of a data signal to determine whether a comparison between a first portion of the data signal and a second portion of the data signal meets the first threshold value comprises comparing a first length of a first block of the first portion and a second length of a second block of the second portion to determine that a difference between the first and second lengths is less than a threshold length. As introduced above, this may correspond to the controller independently analyzing the even and odd data blocks and determining that they have different lengths that are similar enough (i.e., the difference is less than a threshold length).

In some embodiments, adjusting an aspect of the data strobe or the data signal based on a determination that the comparison does not meet the first threshold value comprises increasing a first duty cycle of the first portion and decreasing a second duty cycle of the second portion or decreasing the first duty cycle and increasing the second duty cycle when the difference between the first and second lengths is greater than the threshold length. Thus, the controller may adjust the duty cycle of the data signal to ensure that the even and odd data blocks are of sufficiently similar (or substantially the same) duration. Alternatively, adjusting the aspect may comprise adjusting a timing of the data strobe if there is a discrepancy between the even and odd data blocks with respect to the respective clock signal DQS/DQSB.

In some embodiments, adjusting the duty cycle of the clock signal DQS/DQSB comprises increasing the duty cycle or decreasing the duty cycle of the clock signal DQS/DQSB.

In some embodiments, the controller configured to determine a need to retrain the memory interface based on two-point sampling comprises the controller being configured to identify a single offset based on the minimum offset. The controller configured to determine a need to retrain the memory interface based on two-point sampling further comprises the controller being configured to apply the single offset to the initial trained timing of the trigger signal by defining the first point and the second point about the initial trained timing. The first and second points are defined based on adding a positive value of the single offset to the initial trained timing to create a first point for the two-point sampling and adding a negative value of the single offset to the initial trained timing to create a second point for the two-point sampling. The controller configured to determine a need to retrain the memory interface based on two-point sampling further comprises the controller being configured to compare the first point to a first passing threshold, compare the second point to a second passing threshold, and determine whether either of the first point or the second point exceeds the first passing threshold or the second passing threshold, respectively. The controller configured to trigger the retraining of the memory interface based on a determination that one or more of the two points fails the two-point sampling comprises the controller being configured to retrain the memory interface based on a determination that one of the first point or the second point exceeds the first passing threshold or the second passing threshold, respectively.

In some embodiments, the memory interface and the memory cell are embedded in a memory die. In some embodiments, the event comprises one or more of a process variation, a temperature variation, or a voltage variation in a signal tree associated with the trigger signal or a variation in one or more of a duty cycle of the trigger signal duty cycle or a duty cycle of the data signal.

The above description describes the use of the controller 202 in relation to coordinating data operations with the memory cell structure 242. Such use of the systems and methods described herein may provide various benefits, such as improved error detection capabilities over other embodiments. Such error detection capabilities may include capabilities to detect, for example, changes to tDQS2DQ signals, DQS/DQSB signal duty cycle variations, and/or DQ data signal duty cycle variations. In some embodiments, the systems and methods described herein may reduce training time for the memory interface 230 and/or the memory die 204. Furthermore, the systems and methods described herein do not need to introduce new components to the memory die, different from the embodiments using oscillator circuits.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system XYZOO.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method comprising: detecting a change to one or more of a process, voltage, or temperature (PVT) of a memory device; adjusting a data strobe by adjusting a duty cycle of the data strobe that coordinates a data operation with the memory device based on detection of a change of a duty cycle for the data strobe; monitoring at least one data eye of a data signal to determine whether a comparison between a first portion of the data signal and a second portion of the data signal meets a first threshold value, wherein the adjusted data strobe comprises a first strobe for placement in the first portion and a second strobe for placement in the second portion; and adjusting an aspect of one or more of the adjusted data strobe and the data signal based on a determination that the comparison does not meet the first threshold value.

2. The method of claim 1, further comprising monitoring the duty cycle of the data strobe based on the detected change to one or more of the PVT that exceeds a second threshold.

3. The method of claim 1, wherein monitoring at least one data eye of a data signal to determine whether a comparison between a first portion of the data signal and a second portion of the data signal meets a first threshold value comprises comparing an overlap of a first block of the first portion and a second block of the second portion to the first threshold value to determine that the overlap meets a threshold amount requirement.

4. The method of claim 3, wherein adjusting an aspect of the data strobe or the data signal based on a determination that the comparison does not meet the first threshold value comprises shifting one or more of the first strobe and the second strobe to the left or right with respect to time relative to one or more of the first portion and the second portion, respectively, when the overlap is less than the threshold amount requirement.

5. The method of claim 1, wherein monitoring at least one data eye of a data signal to determine whether a comparison between a first portion of the data signal and a second portion of the data signal meets a second threshold value comprises comparing a first length of a first block of the first portion and a second length of a second block of the second portion to determine that a difference between the first and second lengths is less than a threshold length.

6. The method of claim 5, wherein adjusting an aspect of the data strobe or the data signal based on a determination that the comparison does not meet the second threshold value comprises increasing a first duty cycle of the first portion and decreasing a second duty cycle of the second portion or decreasing the first duty cycle and increasing the second duty cycle when the difference between the first and second lengths is greater than the threshold length.

7. The method of claim 1, wherein adjusting the duty cycle of the data strobe comprises increasing the duty cycle or decreasing the duty cycle.

8. A controller, comprising: a processor; and a memory configured to store instructions that, when executed by the processor in accordance with a clocking signal, cause the processor to: detect a change to one or more of a process, voltage, or temperature (PVT) of a memory device; adjust a data strobe by adjusting the duty cycle of the data strobe that coordinates a data operation with the memory device based on detection of a change of a duty cycle for the data strobe; monitor at least one data eye of a data signal to determine whether a comparison between a first portion of the data signal and a second portion of the data signal meets a first threshold value, wherein the adjusted data strobe comprises a first strobe for placement in the first portion and a second strobe for placement in the second portion; and adjusting an aspect of one or more of the adjusted data strobe and the data signal based on a determination that the comparison does not meet the first threshold value.

9. The controller of claim 8, wherein the instructions further cause the processor to monitor the duty cycle of the data strobe based on the detected change to one or more of the PVT that exceeds a second threshold.

10. The controller of claim 9, wherein the instructions that cause the processor to monitor at least one data eye of a data signal to determine whether a comparison between a first portion of the data signal and a second portion of the data signal meets a first threshold value comprise instructions that cause the processor to compare an overlap of a first block of the first portion and a second block of the second portion to the first threshold value to determine that the overlap meets a threshold amount requirement.

11. The controller of claim 10, wherein the instructions that cause the processor to adjust an aspect of the data strobe or the data signal based on a determination that the comparison does not meet the first threshold value comprise instructions that cause the processor to shift one or more of the first strobe and the second strobe to the left or right with respect to time relative to one or more of the first portion and the second portion, respectively, when the overlap is less than the threshold amount requirement.

12. The controller of claim 8, wherein the instructions that cause the processor to monitor at least one data eye of a data signal to determine whether a comparison between a first portion of the data signal and a second portion of the data signal meets a second threshold value comprise instructions that cause the processor to compare a first length of a first block of the first portion and a second length of a second block of the second portion to determine that a difference between the first and second lengths is less than a threshold length.

13. The controller of claim 12, wherein the instructions that cause the processor to adjust an aspect of the data strobe or the data signal based on a determination that the comparison does not meet the second threshold value comprise instructions that cause the processor to increase a first duty cycle of the first portion and decreasing a second duty cycle of the second portion or decreasing the first duty cycle and increasing the second duty cycle when the difference between the first and second lengths is greater than the threshold length.

14. The controller of claim 8, wherein the instructions that cause the processor to adjust the duty cycle of the data strobe comprise instructions that cause the processor to increase the duty cycle or decreasing the duty cycle.

15. The controller of claim 8, wherein the memory and the processor are mounted to a memory die.

* * * * *